United States Patent [19]

Ohta

[11] Patent Number: 5,761,795
[45] Date of Patent: Jun. 9, 1998

[54] PRESSING APPARATUS FOR CONNECTING TERMINALS OF FLEXIBLE CIRCUIT BOARD

[75] Inventor: Tetsufumi Ohta, Kawaguchi, Japan

[73] Assignee: Enplas Corporation, Saitama, Japan

[21] Appl. No.: 539,609

[22] Filed: Oct. 5, 1995

[30] Foreign Application Priority Data

| Oct. 5, 1994 | [JP] | Japan | 6-241420 |
| Oct. 18, 1994 | [JP] | Japan | 6-251765 |
| Oct. 18, 1994 | [JP] | Japan | 6-251766 |

[51] Int. Cl.$^6$ .................................................. H05K 3/32
[52] U.S. Cl. .......................... 29/739; 29/759; 29/760; 29/834; 29/836; 29/842; 269/903
[58] Field of Search ...................... 29/739, 740, 741, 29/759, 760, 834, 836, 842; 269/903

[56] References Cited

U.S. PATENT DOCUMENTS

| 5,158,490 | 10/1992 | Kong | 29/739 X |
| 5,276,962 | 1/1994 | Harting et al. | 29/739 X |
| 5,285,105 | 2/1994 | Cain | 29/760 X |
| 5,289,633 | 3/1994 | Okafuji et al. | 29/760 X |
| 5,332,463 | 7/1994 | Eberlein et al. | 269/903 X |
| 5,501,004 | 3/1996 | Onitsuka | 29/739 X |
| 5,504,988 | 4/1996 | Avery et al. | 29/760 X |

FOREIGN PATENT DOCUMENTS 2-78969  3/1990  Japan ........................... 29/739

*Primary Examiner*—Peter Vo
*Attorney, Agent, or Firm*—Fish & Richardson P.C.

[57] ABSTRACT

A pressing unit 9 pressing the back surface of a flexible circuit board 8 having a case and a plurality of plate-like pressing members 23 which are accommodated in the case while being superposed on each other. Each pressing member 23 has a base portion 23a, a pressing portion 23b, and a spring portion 23c integrally connecting them. The pressing portion 23b is extended along a direction of arrangement of connecting terminals 4 arranged on electric components. The pressing member 23 presses the back surface of the flexible circuit board 8 by utilizing the elasticity of the spring portion 23c, and therefore can bring the connecting terminals 4 of the electric components and connecting terminals 11 of the flexible circuit board 8 into contact with each other by a generally equal contact pressure.

29 Claims, 25 Drawing Sheets

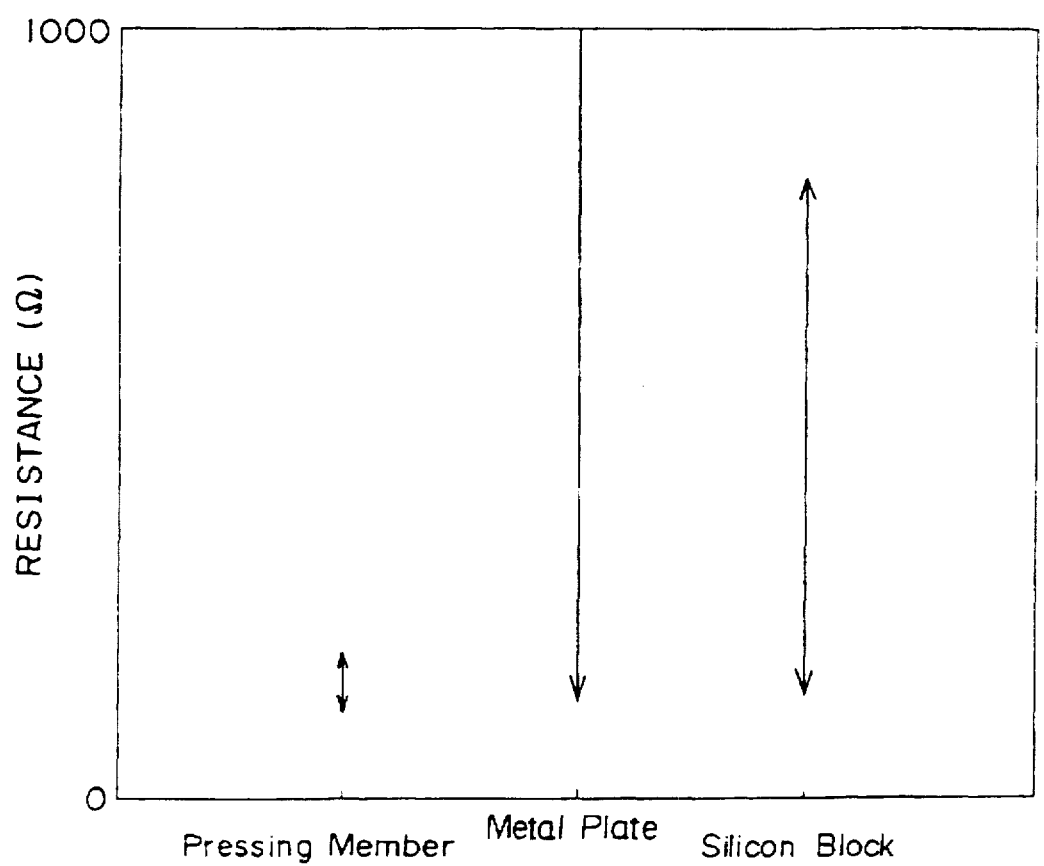

209  209b  209a 209b    208

211

PRESSING APPARATUS FOR CONNECTING TERMINALS OF FLEXIBLE CIRCUIT BOARD

BACKGROUND OF THE INVENTION

1. Field of the Invention

The present invention relates to a pressing apparatus for connecting terminals of a flexible circuit board. More particularly, the invention relates to a pressing apparatus which presses the back surface of a flexible circuit board to bring the connecting terminals formed on a front surface of the flexible circuit board into contact with a plurality of connecting terminals arranged in parallel to each other on electric components with a required contact pressure.

2. Description of the Related Art

In recent years, along with the increasing integration of circuits, the number of the connecting terminals of various types of electric components has sharply increased and, also, the pitch between terminals has been made finer. A technique has been known for connecting the connecting terminals provided on the flexible circuit board to such connecting terminals by a pressing apparatus in a detachable manner. Of course, such a connection technique can be utilized also for a usual connector in electrical products, measuring apparatuses, etc., but it has been regarded as an important technique in the inspection stage of electric components etc. or in the fabrication and testing stages of the prototypes.

Japanese Unexamined Patent Publication (Kokai) No. 2-78969 shows an inspection apparatus used for inspection of the display quality etc. of a liquid crystal display panel. As seen also from this example, a plurality of external contact terminals are provided on the glass substrate of the liquid crystal display panel at a fine pitch. Therefore, so as to electrically connect the connecting terminals provided on the flexible circuit board to the connecting terminals of the liquid crystal display panel, the back surface of the flexible circuit board is pressed by the pressing member. However, since a plurality of connecting terminals are pressed at one time, even though the back surface of the pliable flexible circuit board is pressed, it is extremely difficult to equalize the contact pressures of all of the connecting terminals. Variation of the contact pressures of the connecting terminals in a liquid crystal display panel inspection apparatus becomes a cause of lower precision of inspection of the display quality etc. of the liquid crystal display panel. Also, when the pressing force is increased to enable equalization of the contact pressures, a difference occurs in stress in different regions of the glass substrate, which exerts an influence upon the tone of the display portion. For this reason, the development of an easy and effective enhanced technology which can equalize the contact pressures has been demanded.

In Japanese Unexamined Patent Publication (Kokai) No. 6-112373, there is shown an IC socket to which electric components such as an IC package are detachably attached so that those electric components can be electrically connected to various types of circuit boards. There are various types of IC packages. The connecting terminals thereof include ones provided on a hard substrate on which the IC is integrally placed and types such as in an IC package of the QFP type disclosed in this publication wherein a plurality of lead terminals comprised of hard connecting terminals are projected from the main body to the four directions. In this publication, the IC package is placed on a flexible circuit board provided on the IC socket side and the lead terminals of the IC package are pressed down from above by a pad, whereby electric connection can be established between the IC package and the IC socket. However, the pressing of such hard lead terminals (connecting terminals) by a pad (pressing member), while sufficient for establishing contact, is not adequate enough to equalize the contact pressures between the lead terminals (connecting terminals) of electric components and the connecting terminals of the flexible circuit board as mentioned above.

Conventionally, as a pressing member for pressing a flexible circuit board as described above, a hard metal plate and a member made of rubber have been used. In the case of a metal plate, however, it is difficult to secure a sufficient degree of parallelism between the contact surfaces of the contact terminals and the pressing surface of the metal plate, and therefore at the time of attachment of the metal plate to the pressing apparatus, there was a problem that fine adjustment was required. Also, in the case of a pressing member made of a silicone rubber, since a silicone rubber per se is a soft material and the pressing member per se is formed thin and long, there was a problem in that the pressing force at the two ends of the pressing member became smaller than the pressing force in the part between them.

SUMMARY OF THE INVENTION

Accordingly, an object of the present invention is to provide a pressing apparatus with which a plurality of contact terminals formed on a flexible circuit board can be brought into contact with a plurality of connecting terminals arranged on the surface of various types of electric components at a predetermined pitch with a generally equal contact pressure.

According to one aspect of the present invention, there is provided a pressing apparatus for electrically connecting a plurality of connecting terminals formed on a front surface of a flexible circuit board to a plurality of connecting terminals arranged in parallel with each other on the electric components by pressing the back surface of the flexible circuit board, characterized in that provision is made of a supporting member and a plurality of plate-like pressing members disposed in parallel along a direction of arrangement of the aforesaid connecting terminals of the aforesaid electric components while overlapping each other; each of the aforesaid pressing members has a base portion which is attached to the aforesaid supporting member, a thin and long pressing portion which is spaced away from the aforesaid base portion and extends along the direction of arrangement of the connecting terminals of the aforesaid electric components, and a spring portion connecting the aforesaid base portion and the aforesaid pressing portion; and the aforesaid pressing portion is pressed against the back surface of the aforesaid flexible circuit board.

In the pressing apparatus of the above-described configuration, by pressing the back surface of the flexible circuit board by the pressing portions of the plate-like pressing members, the connecting terminals of the flexible circuit board and the connecting terminals of the electric components can be brought into contact with each other with a predetermined contact pressure. The pressing portions of the plate-like pressing members are integrally connected via the spring portion, and therefore even if there is error in precision due to processing or assembly of the plate-like pressing members in the degree of parallelism between the pressing portion and the contact surfaces of the connecting terminals, that precision error can be absorbed by the spring portion at the time of pressing of the flexible circuit board. Accordingly, the connecting terminals of the flexible circuit board and the connecting terminals of the electric components can be brought into contact with a generally equal contact pressure. Also, when a foreign substance such as dust is attached to the back surface of the flexible circuit board, the pressing portion abutting against the foreign substance cannot equally press the connecting terminals, but since a plurality of plate-like pressing members are attached to the supporting member while overlapping each other, even if the equality of the pressing force of some of the plate-like pressing members is degraded, the connecting terminals can be equally pressed by the pressing portions of the other plate-like pressing members not abutting against the foreign substance. Accordingly, the connecting terminals of the flexible circuit board and the connecting terminals of the electric components can be reliably brought into contact with each other. Further, in each plate-like pressing member, the base portion, the pressing portion, and the spring portion are integrally constituted, and therefore fabrication is easy.

In the pressing apparatus of the above-described configuration, preferably the aforesaid spring portion is connected to the aforesaid base portion at one position and is connected to the aforesaid pressing portion at two positions and, at the same time, is formed by a first spring portion urging the aforesaid pressing portion in a lateral direction and a second spring portion urging the aforesaid pressing portion in a longitudinal direction.

According to another aspect of the present invention, there is provided a pressing apparatus for electrically connecting a plurality of connecting terminals arranged in parallel to each other on electric components and connecting terminals formed on a front surface of the aforesaid flexible circuit board at the same pitch as that for the connecting terminals of the aforesaid electric components by pressing the back surface of the flexible circuit board, characterized in that: provision is made of a supporting member and a plurality of plate-like pressing members disposed in parallel along a direction of arrangement of the aforesaid connecting terminals of the aforesaid electric components while overlapping each other; each of the aforesaid pressing members has a base portion which is attached to the aforesaid supporting member and a plurality of pressing portions connected to the aforesaid base portion; the front ends of the aforesaid pressing portions in the aforesaid pressing members are arranged in a direction schematically perpendicular to the direction of arrangement of the aforesaid connecting terminals of the aforesaid electric components; and the aforesaid pressing portion is pressed against the back surface of the aforesaid flexible circuit board.

In the pressing apparatus of the above-described structure, the connecting terminals of the electric components and the connecting terminals of the flexible circuit board can be reliably brought into contact with each other with a generally equal contact pressure. In addition, the connecting terminals of the flexible circuit board are pressed from the back surface of the flexible circuit board at a plurality of pressing points, and therefore the contact resistance can be lowered. Also, the configuration is simple, and therefore the fabrication is easy.

According to still another aspect of the present invention, there is provided a pressing apparatus for electrically connecting a plurality of connecting terminals arranged in parallel to each other on electric components and connecting terminals formed on a front surface of the aforesaid flexible circuit board at the same pitch as that for the connecting terminals of the aforesaid electric components by pressing the back surface of the flexible circuit board, characterized in that: provision is made of a pressing member having an elastic body and a plurality of rigid bodies; the aforesaid rigid bodies are embedded in the aforesaid elastic body while being spaced from each other so that a part of each of the aforesaid rigid bodies is exposed from the surface of the aforesaid elastic body in exactly generally the same amount; and the aforesaid pressing member is pressed against the back surface of the aforesaid flexible circuit board by the exposed portions of the aforesaid rigid bodies.

In the pressing apparatus having the above-described configuration, the connecting terminals of the electric components and the connecting terminals of the flexible circuit board can be reliably brought into contact with each other with a generally equal contact pressure. In addition, they can be pressed against the respective connecting terminals of the flexible circuit board from the back surface of the flexible circuit board at a plurality of pressing points by the exposed portions of the rigid bodies, and therefore the contact resistance between the connecting terminals can be lowered. Also, since the configuration is simple, the fabrication is easy.

The above-described and other configurations and advantages will be apparent by the following explanation referring to the drawings.

BRIEF DESCRIPTION OF THE DRAWINGS

FIG. 7 is a graph showing experimental comparative data between the first embodiment of the present invention and another example of the configuration;

DESCRIPTION OF THE PREFERRED EMBODIMENTS

FIG. 1 through FIG. 8 show an example in which a pressing apparatus according to a first embodiment of the present invention is applied to an inspection apparatus of a liquid crystal display panel.

Figure 1:
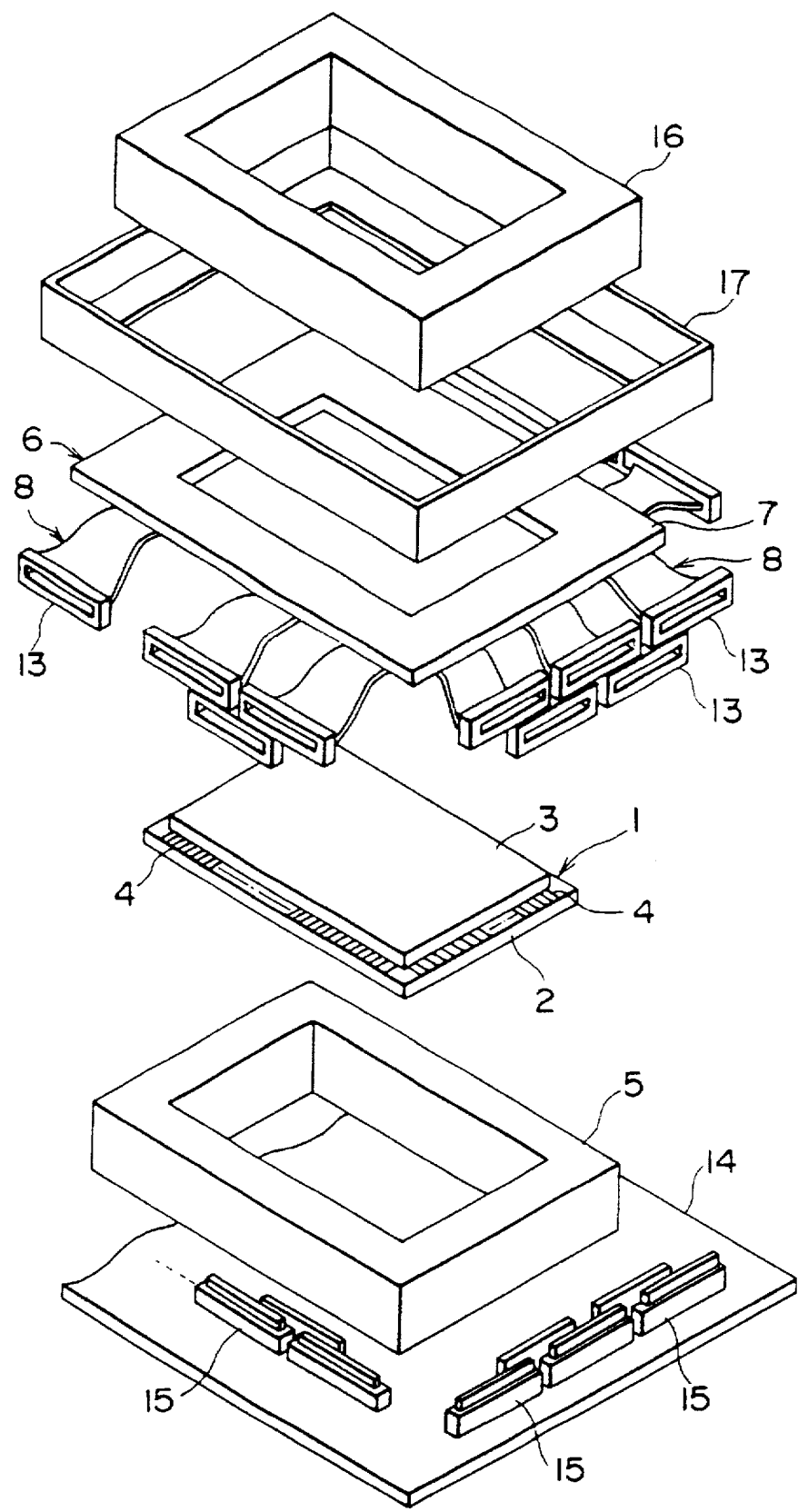
FIG. 1 is an exploded perspective view of an inspection apparatus for a liquid crystal display panel using a pressing apparatus according to a first embodiment of the present invention.
Figure 2:
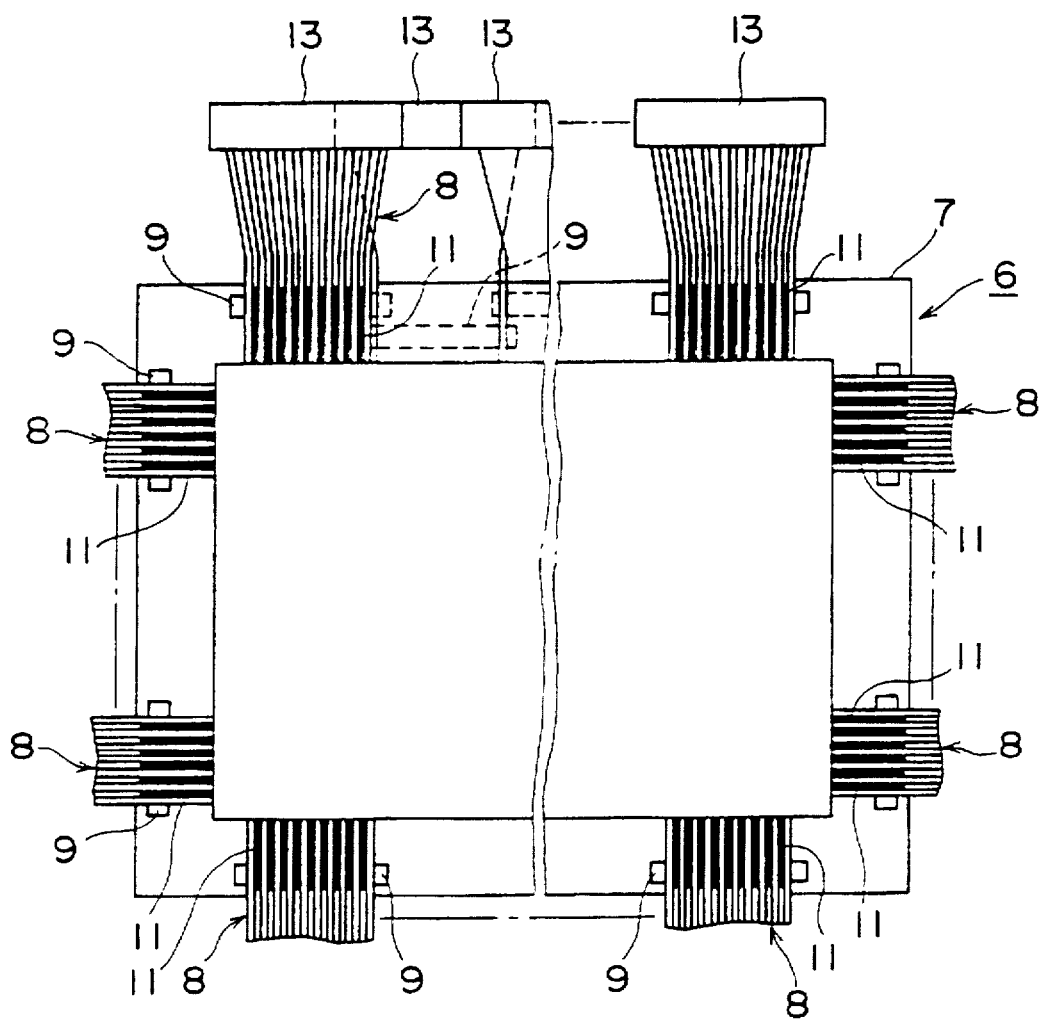
FIG. 2 is a partially cut-away bottom view of the pressing apparatus of the first embodiment.
Figure 3:
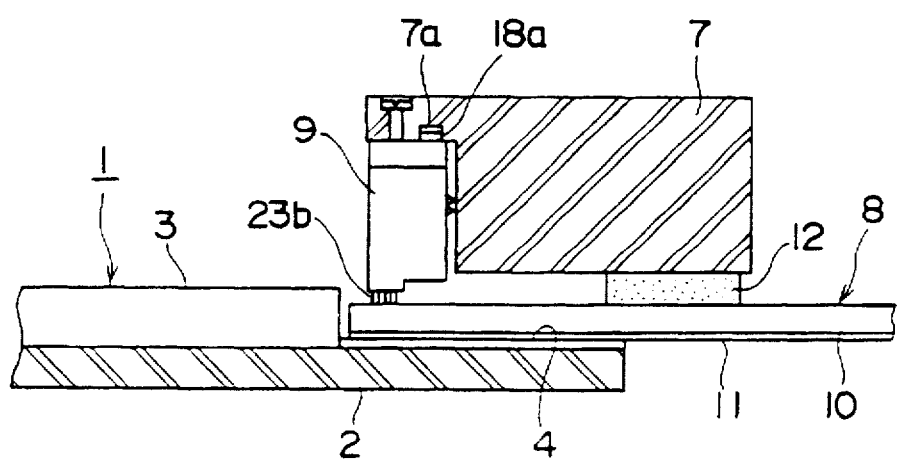
FIG. 3 is a longitudinal cross-sectional view of principal parts showing a pressing state of the pressing apparatus of the first embodiment.

First, referring to FIG. 1 through FIG. 3, a liquid crystal display panel 1 has a transparent insulating substrate 2 made of a glass or the like and a liquid crystal display portion 3 formed on this. On the periphery of the surface of the insulating substrate 2, a plurality of connecting terminals 4 connected to the display elements disposed inside the liquid crystal display portion 3 are arranged at fine intervals. The connecting terminals 4 are usually formed by an electrode film of indium-tin-oxide (ITO). The liquid crystal display panel 1 is placed positioned on the base stand 5. When the liquid crystal display panel 1 is a transparent type, an illumination device is disposed inside the base stand 5.

The pressing apparatus 6 is for pressing the flexible circuit board 8 against the connecting terminals 4 formed in the peripheral portions of the insulating substrate 2 from an upper portion thereof. This pressing apparatus 6 is constituted by a pressing frame 7, a plurality of flexible circuit boards 8, and a plurality of pressing units 9. The flexible circuit boards 8 are attached to the pressing frame 7 by an adhesive 12. Each of the flexible circuit boards 8 comprises a flexible insulating film 10 which is made of polyimide or the like and connecting terminals 11 which are made of silver paste or the like and printed on the flexible insulating film 10 at one end portion thereof. The number of the connecting terminals 4 and the number of the connecting terminals 11 are the same, and also the inter-terminal pitches thereof are the same. The pressing units 9 are secured to the pressing frame 7 by screws as shown in FIG. 3 and, as shown in FIG. 2, are disposed in a zigzag manner in the pressing frame 7.

As shown in FIG. 1, at the other end portions of the flexible circuit boards 8, connectors 13 are attached. These connectors 13 can be connected to connectors 15 provided on the substrate 14. The connectors 15 are connected to a liquid crystal driving circuit (not illustrated). The liquid crystal display portion 3 of the liquid crystal display panel 1 is turned on by this driving circuit, and the state of display thereof is inspected by the naked eye etc. Also, in the upper portion of the pressing apparatus 6, a weight 16 for pushing the pressing apparatus 6 and a supporting frame 17 which enables adjustment of positioning are provided.

Figure 4:
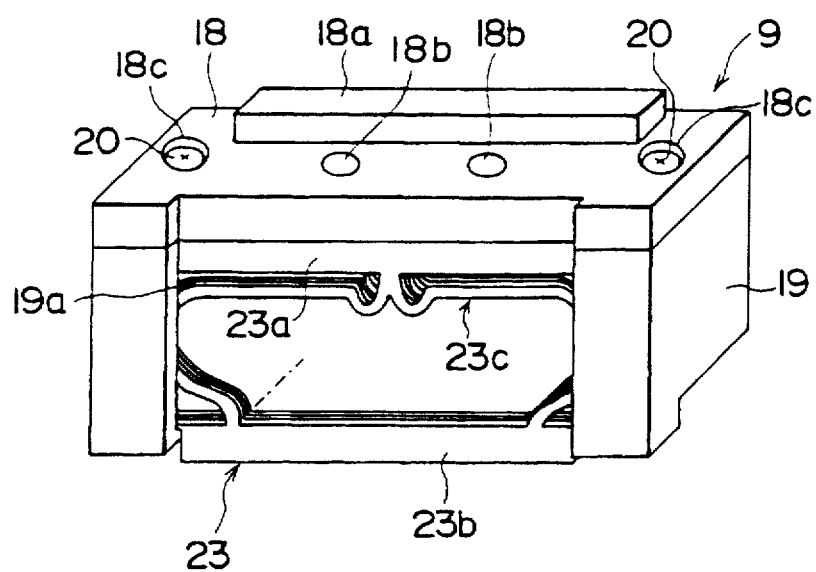
FIG. 4 is a perspective view of a pressing unit to be used in the pressing apparatus of the first embodiment.
Figure 5A:
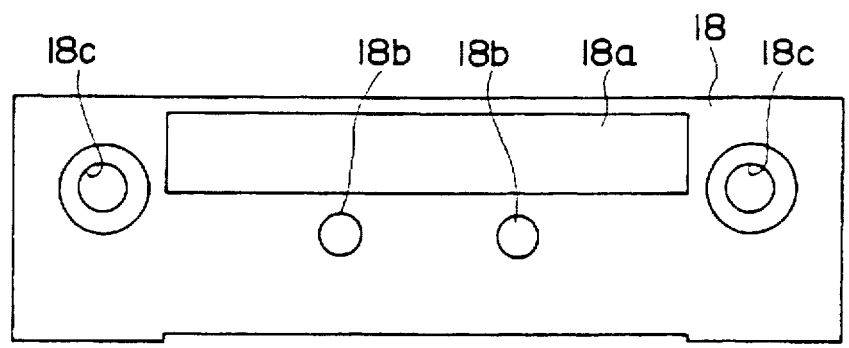
FIG. 5A is a plan view of a lid of a case of the pressing unit shown in FIG. 4.
Figure 5B:
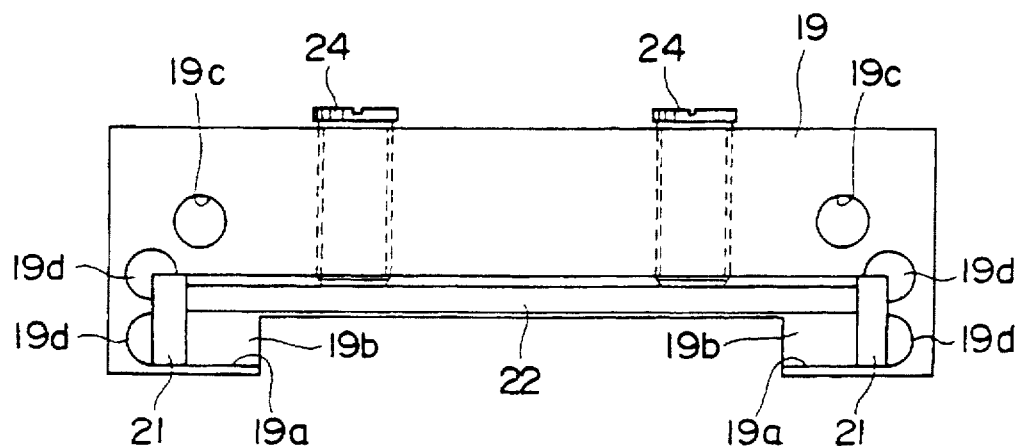
FIG. 5B is a plan view of a case body of the pressing unit shown in FIG. 4.
Figure 6:
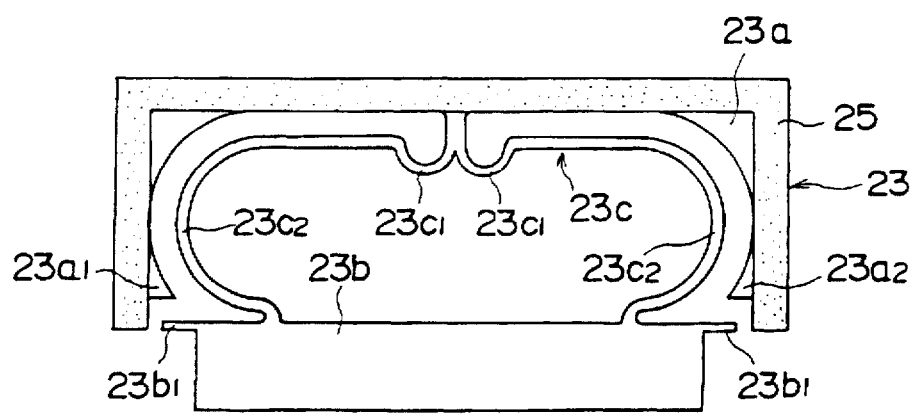
FIG. 6 is a front view of the plate-like pressing member to be accommodated in the case of the pressing unit shown in FIG. 4.

Next, referring to FIG. 4 through FIG. 6, the pressing unit 9 is provided with a case serving as the supporting member. This case comprises a lid 18 and a case body 19. In the lid 18, as shown in FIG. 3, are formed a projection portion 18a for fitting in a groove 7a provided in the pressing frame 7, two screw holes 18b for securing to the pressing frame 7 by screws, and two screw holes 18c for securing to the case body 19 by two screws 20. Note that, the upper portions of the screw holes 18c are countersunk so that the heads of the screws 20 are recessed.

In the case body 19, engagement portions 19a are formed on both sides of the front surface (lower surface in FIG. 5B) and engagement portions 19b are formed on both sides of the bottom surface. Two screw holes 19c for securing to the lid 18 by the screws 20 are provided in the upper surface. Side plates 21 are disposed on the two sides of the internal portion of the case body 19 so as to cover the relief groove 19d during processing, and a thick plate 22 is disposed between these side plates 21. In FIG. 5B, a plurality of pressing members 23 as shown in FIG. 6 are accommodated in the space surrounded by the engagement portions 19a, 19b, the side plates 21, and the thick plate 22. The close contact of the pressing members 23 is established by pressing the thick plate 22 from the back side of the case body 19 to the front surface side by two adjustment screws 24. Note that, where it is satisfactory even if the relief groove 19d is not provided in processing, needless to say the side plates 21 become unnecessary.

As shown in FIG. 6, the pressing members 23 are punched from a plate material made of a metal by press machining. The material of the pressing members 23 is not particularly restricted, but beryllium copper is preferable where the dimensions are small and phosphor bronze, steel, etc. are preferable in the case of a large size. The base portion 23a of each of the pressing members 23 has generally a U-shape. Tape 25 (indicated by dots) is adhered along each side. To the base portion 23a, a pressing portion 23b exhibiting a thin and long plate shape is connected via a spring portion 23c. In the pressing portion 23b, engagement portions $23b_1$ are formed on the two ends thereof. Also, the spring portion 23c is connected to the base portion 23a at one position and to the pressing portion 23b at two positions and has a first spring portion $23c_1$ and second spring portion $23c_2$ which are symmetrical right and left. An urging force in a lateral direction in the figure is given to the first spring portion $23c_1$. The second spring portion $23c_2$ has a higher rigidity than that of the first spring portion $23c_1$. An urging force in a vertical direction is given to this.

The pressing unit 9 is constituted by an assembly of these components. In the state shown in FIG. 4, in the pressing member 23 at the frontmost surface, two end sides $23a_1$ and $23a_2$ of the base portion 23a having generally a U-shape are in contact with the engagement portions 19a of the case body 19. Also, the engagement portion $23b_1$ formed on the pressing portion 23b of each pressing member 23 is engaged with the engagement portion 19b of the case body 19 by the elastic urging force of the spring portion 23c. However, in the case of this embodiment, the engagement portion $23b_1$ is formed at generally the same height position as the lower front end position of the two end sides $23a_1$ and $23a_2$ of the base portion 23a, and therefore it is not always necessary for the precision of processing of the components of the pressing member 23 be good.

When the liquid crystal display panel 1 is inspected, such a pressing unit 9 is pressed against the back surface of the flexible circuit board 8, whereby the connecting terminals 4 and the connecting terminals 11 are electrically connected. At this time, in the present embodiment, the pressing portions 23b of the pressing members 23 are rigid bodies, and therefore a generally equal contact pressure can be given to a plurality of connecting terminals over the entire length direction thereof. Also, where the pressing apparatus 6 is pushed by a mechanical apparatus etc., even if a slight variation occurs in the force of pushing whenever the pressing apparatus 6 is pushed, there is no damage to the flexible circuit boards and no influence exerted upon the contact pressure because the spring portion 23c is flexed.

Also, even if the pressing unit 9 is slightly inclined with respect to the insulating substrate 2, in the present embodiment, it is possible to give the contact pressure generally equally to between adjacent connecting terminals. Namely, where the pressing unit 9 is inclined to the front or back in FIG. 4, the amount of flexing of the spring portion 23c of each pressing member 23 becomes different, and the pressing force of each pressing member 23 changes, but is no difference in the pressing force in the length direction of the pressing portion 23b for each of the pressing members, and therefore no variation is caused in the contact pressure of the connecting terminals. Also, where the pressing unit 9 is inclined to the left or right in FIG. 4, the spring portion 23c of the pressing member 23 has different flexing amounts in the left and right thereof. Some of the difference is absorbed by the second spring portion $23c_2$, but most of the difference is absorbed by the first spring portion $23c_1$, and almost no variation is caused in the contact pressure in the contact portions of the connecting terminals.

Figure 36:
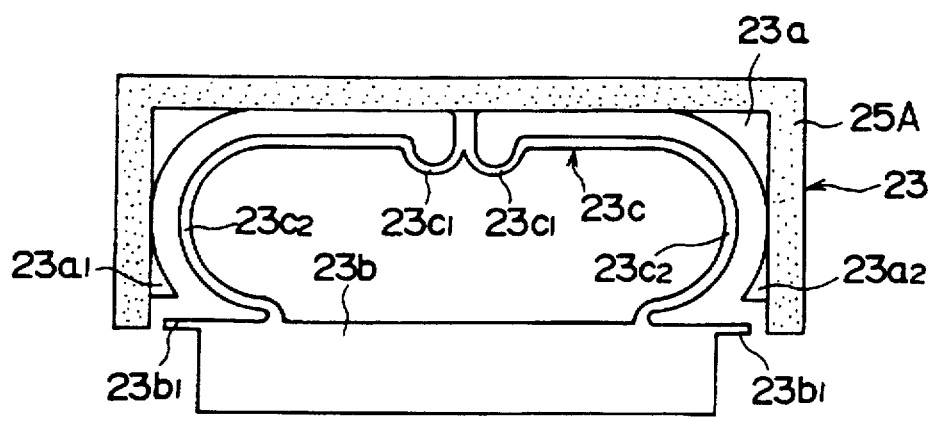
FIG. 36 shows a front view of a modified pressing member to be accommodated in the case of the pressing unit shown in FIG. 4.

As described above, it is understood that the formation of the pressing portion 23b and the spring portion 23c in the pressing member 23 is extremely important, but in the present embodiment, so as to further enhance the effect, tape 25 is adhered to the base portion 23a of the pressing member 23 in generally a U-shape. This is for giving a constant space between the pressing members. By this, the flexing of the spring portion 23c becomes smoothly carried out. Accordingly, as shown in FIG. 36, it is also possible to make this part thicker by providing a surface treatment layer such as plating layer on the base portion 23a of the pressing member 23 in place of the tape 25, or a similar effect can be obtained even if another component acting as a spacer is interposed.

FIG. 7 shows the results of measurement of the variation of the resistance values in the connecting terminals 4 in a case where a flexible circuit board 8 is pressed by the pressing unit 9 having the above-described configuration, a case where the same flexible circuit board 8 is pressed by a rigid metal plate which does not resiliently deform much at all, and a case where the same flexible circuit board 8 is pressed by a block made of a silicone rubber which can resiliently deform. Note that, the pressing member used in the product based on this embodiment is made of phosphor bronze, and the thickness thereof is 0.15 millimeter. The lateral dimension of the base portion 23a in FIG. 6 is about 40 millimeters, and the vertical dimension is about 15 millimeters. The vertical dimension of the pressing portion 23b is about 5.5 millimeters, and the length dimension of the pressing surface is about 30 millimeters. Also, 0.05 millimeter size tape is used. The measurement of the resistance value was carried out by connecting one end of a tester to the flexible circuit board and bringing it into contact with the individual indium-tin-oxide films (ITO) serving as the connecting terminals of the liquid crystal display panel. It will be clearly understood from FIG. 7 that the first embodiment of the present invention exhibits excellent effects. Note that, the measurement was carried out changing the number of the pressing member in various ways, but similar results could be obtained within a range of from five to 15 members.

Figure 8A:
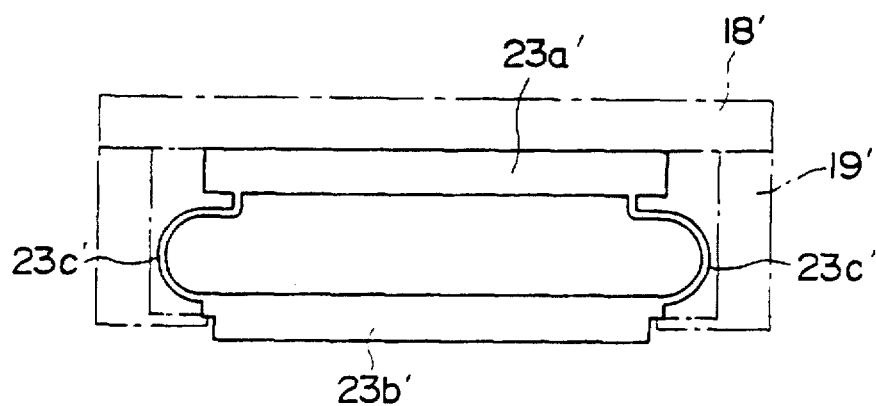
FIG. 8A and FIG. 8B are front views showing modifications of the plate-like pressing member of the first embodiment, respectively.
Figure 8B:
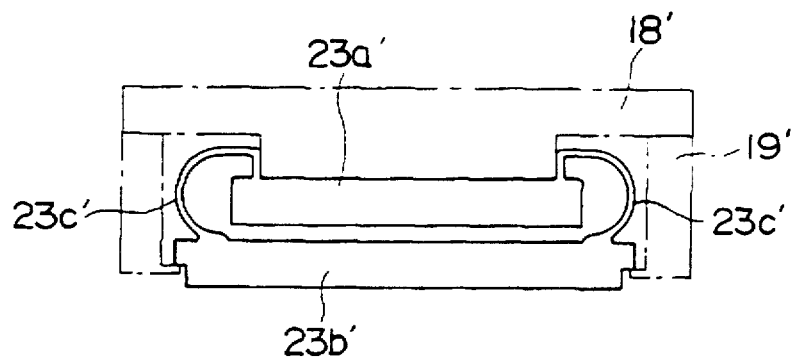

FIG. 8A and FIG. 8B show modifications of the pressing member 23. The pressing member 23 shown in FIG. 8A has a configuration wherein the base portion 23a' and the pressing portion 28b' are integrally connected by two independent spring portions 23c'. By adopting such a shape, the fabrication of die clearly becomes easier. Also, the pressing member 23 shown in FIG. 8B has a configuration wherein the base portion 23a' and the pressing portion 28b' are connected by two independent spring portions, and the shape of the spring portion 23c' is different from that of FIG. 8A. As seen from a comparison between FIG. 8A and FIG. 8B, the spring portion shown in FIG. 8B can clearly reduce the dimensions of the pressing unit in the vertical direction and the horizontal direction. Also, as a modification of the pressing member 23 of FIG. 8A, it is also possible to use only either one of the spring portions and connect the same with the base portion at the center of the pressing portion. Further, it is possible to make the number of the pressing members 23 accommodated in the case two or more.

Figure 9A:
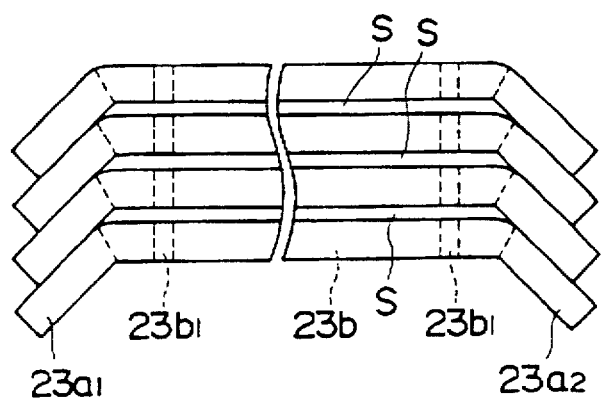
FIG. 9A is an explanatory view showing a state where two end sides of the plate-like pressing member of the first embodiment are folded back in the same direction and superposed on each other.
Figure 9B:
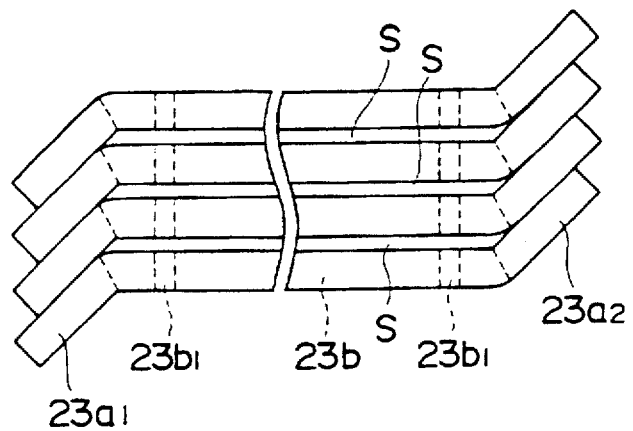
FIG. 9B is an explanatory view showing a state where two end sides of the plate-like pressing member of the first embodiment are folded back in the opposite directions and superposed on each other.

Moreover, it is also possible to form a predetermined space S between the pressing portion 23b and the spring portion 23c of each pressing member when the pressing members 23 are superposed on each other as shown in FIG. 9A and FIG. 9B by folding back the two end sides 23$a_1$ and 23$a_2$ in the base portion 23a at a predetermined angle in advance. As the bending direction in that case, it is also possible to bend both of the two end sides 23$a_1$ and 23$a_2$ in the same direction as shown in FIG. 9A or bend the same in opposite directions to each other as shown in FIG. 9B.

Further, in FIG. 2, the pressing units 9 are disposed in a zigzag manner, but it is possible to reduce the number by enlarging the shape of the pressing unit 9, in other words, the size of the pressing member, and in certain cases, it is possible to make it sufficient to dispose one pressing unit each at each side of the liquid crystal display panel 1. Further, the pressing apparatus 6 can be used also for establishing electric connection with various electric components such as an IC socket, connector, etc. and various circuits other than the inspection apparatus of the liquid crystal display panel. In that case as well, it is sufficient that the pressing apparatus 6 be disposed so as to be able to press the back surface of the flexible circuit board and not prevent the movement of the hard substrate side instead of movement of the pressing apparatus 6 for pressing as in the above-described first embodiment.

FIG. 10 through FIG. 21 show an example in which a pressing apparatus according to the second embodiment of the present invention is applied to the inspection apparatus of a liquid crystal display panel.

Figure 10:
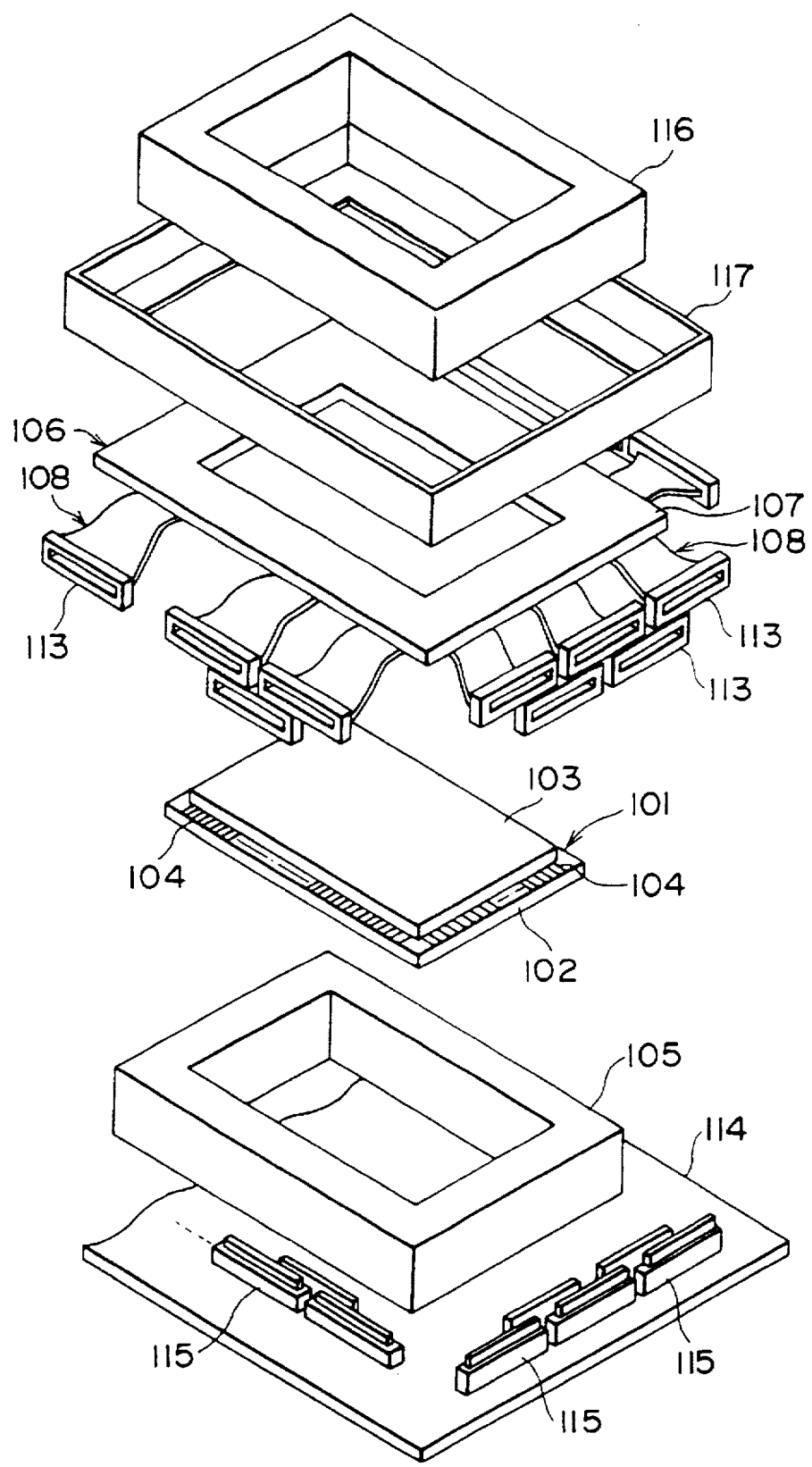
FIG. 10 is an exploded perspective view of the inspection apparatus for a liquid crystal display panel using the pressing apparatus according to a first embodiment of the present invention.
Figure 11:
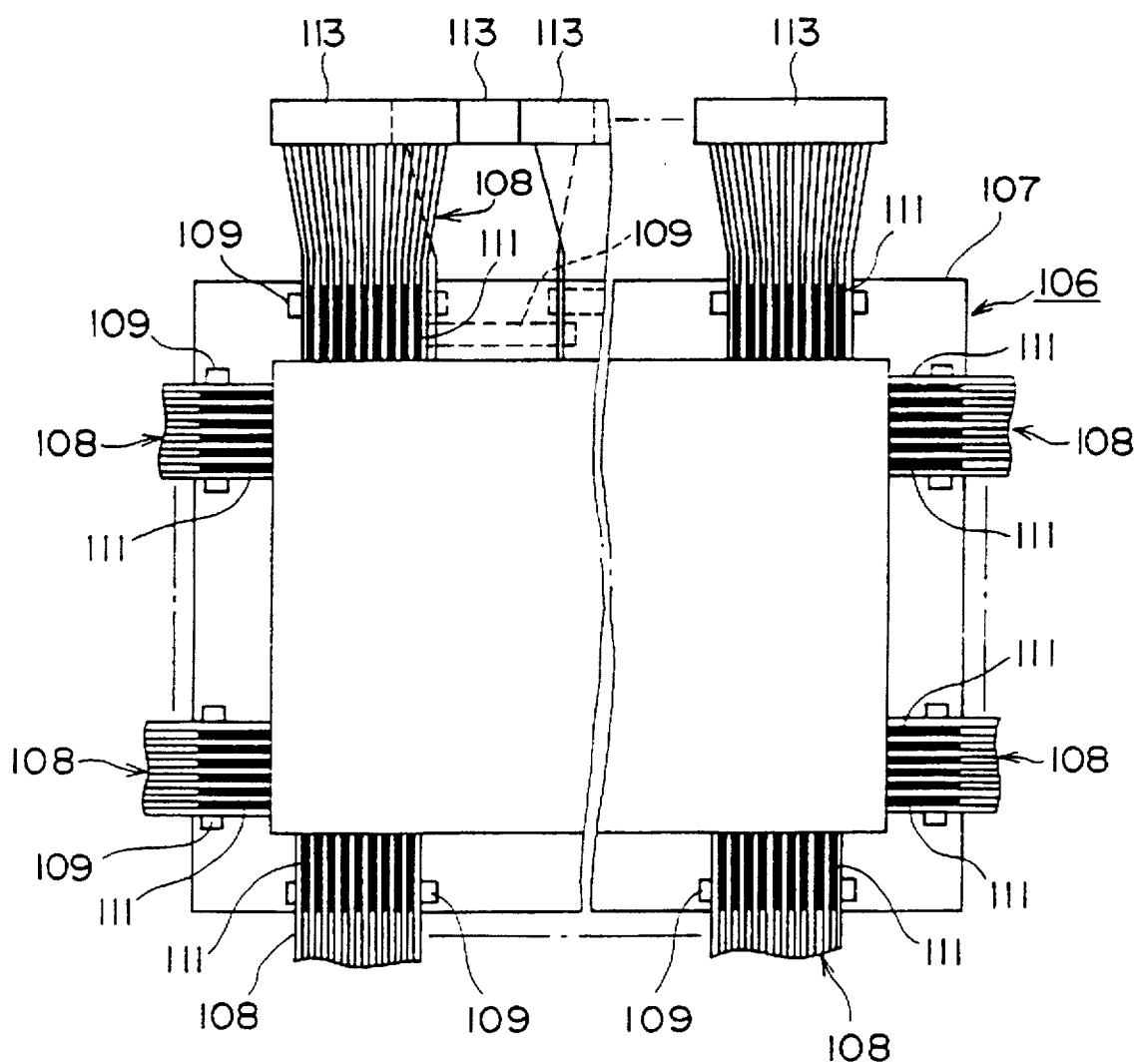
FIG. 11 is a partially cut-away bottom view of the pressing apparatus of a second embodiment.
Figure 12:
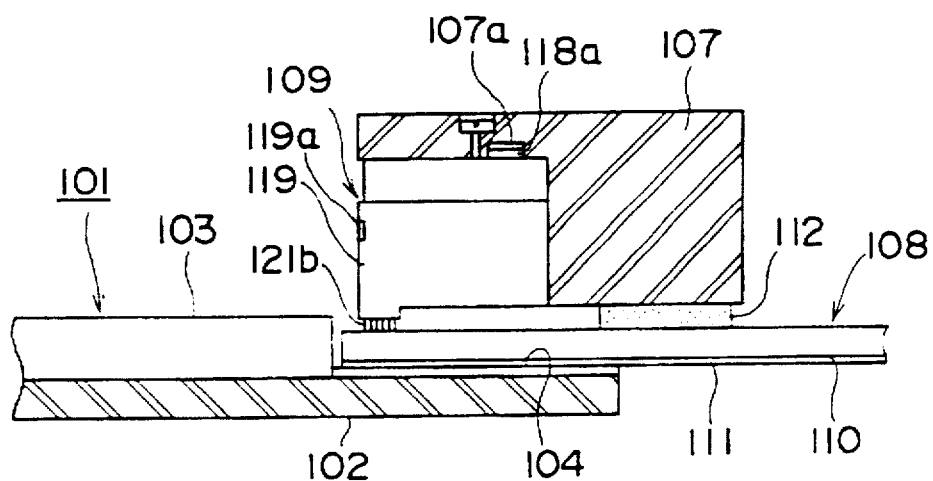
FIG. 12 is a longitudinal cross-sectional view of principal parts showing the pressing state of the pressing apparatus of the second embodiment.

First, referring to FIG. 10 through FIG. 12, the liquid crystal display panel 101 has a transparent insulating substrate 102 made of a glass or the like and a liquid crystal display portion 103 formed on this. On the periphery of the surface of the insulating substrate 102, a plurality of connecting terminals 104 connected to display elements disposed inside the liquid crystal display portion 103 are arranged at extremely fine intervals. The connecting terminals 104 are usually formed by an electrode film of indium-tin-oxide (ITO). The liquid crystal display panel 101 is placed positioned on the base stand 105. When the liquid crystal display panel 101 is a transparent type, an illumination device is disposed inside the base stand 105.

The pressing apparatus 106 is for pressing the flexible circuit boards 108 against the connecting terminals 104 formed in the peripheral portions of the insulating substrate 102 from an upper portion thereof. This pressing apparatus 106 is constituted by a pressing frame 107 and a plurality of pressing units 109. The flexible circuit boards 108 are attached to the pressing frame 107 by an adhesive 112 and have at one end portions thereof silver paste applied onto the insulating film 110 to form connecting terminals 111. The number of the connecting terminals 104 and the number of the connecting terminals 111 are the same, and also the inter-terminal pitches thereof are the same. The pressing units 109 are secured to the pressing plate 107 by screws as shown in FIG. 12 and, at the same time, as shown in FIG. 11, they are disposed in a zigzag manner in the pressing plate 107.

As shown in FIG. 10, to the other end portions of the flexible circuit boards 108, the connectors 113 are attached. The connectors 113 can be connected to connectors 115 provided on the substrate 114. The connectors 115 are connected to a liquid crystal driving circuit (not illustrated). The liquid crystal display portion 103 of the liquid crystal display panel 101 is turned on by this driving circuit, and the state of display thereof is inspected by the naked eye etc. Also, in the upper portion of the pressing apparatus 106, a weight 116 for pushing the pressing apparatus 106 and a supporting frame 17 which enables adjustment of positioning are provided.

Next, the configuration of the pressing unit 109 of the pressing apparatus 106 will be explained by referring to FIG. 13 through FIG. 15. The pressing unit 109 has a case which serves as the supporting member. That case comprises a lid 118 and a case body 119. In the lid 118, as shown in FIG. 12, there are formed a projection portion 118a fitted in a groove 107a provided in the pressing frame 107, two screw holes 118b for securing to the pressing frame 107 by screws, and two screw holes 118c for securing to the case body 119 by two screws 120 are formed. Note that, the upper portions of the screw holes 118c are countersunk so that the heads of the screws 120 are recessed. On the other hand, the case body 119 is fabricated by separate components at the front surface thereof, an engagement portion 119a which is integrally formed is formed later, and a bottom portion 119b, rear wall 119c, and side walls 119d are formed.

Figure 13:
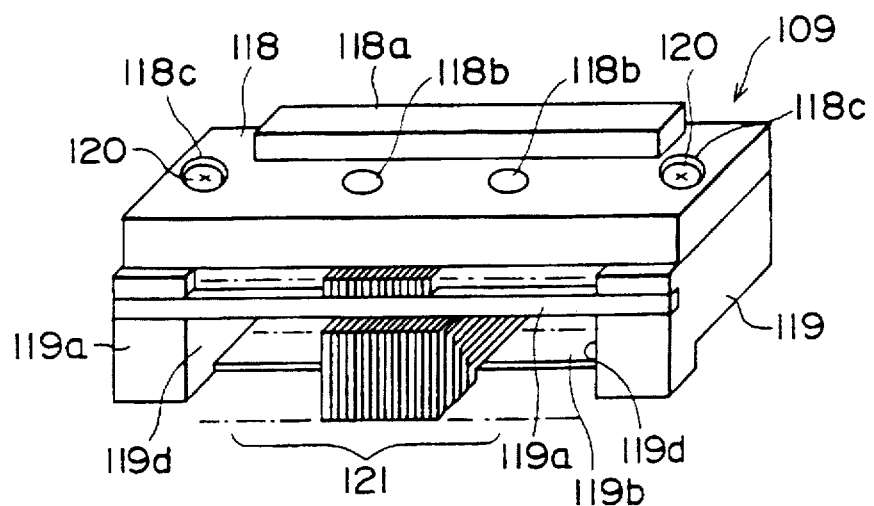
FIG. 13 is a perspective view of the pressing unit which is used in the pressing apparatus of the second embodiment.
Figure 14:
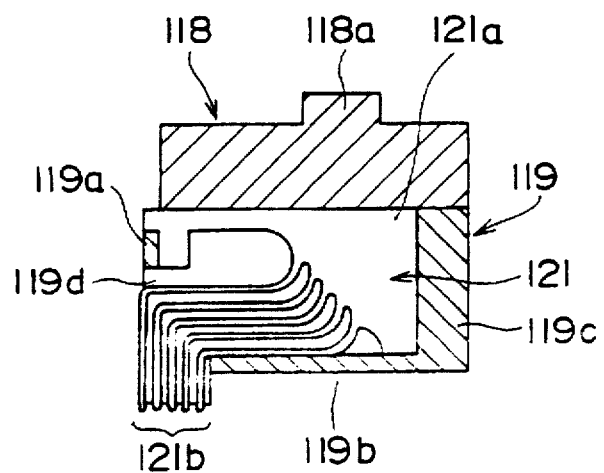
FIG. 14 is a longitudinal cross-sectional view of the pressing unit shown in FIG. 13.

As shown in FIG. 13, a plurality of pressing members 121 are accommodated in the case body 119. As shown in FIG. 15, the pressing members 121 are punched from a plate material made of a metal by press machining. The material of the pressing members 121 is not particularly restricted, but beryllium copper is preferable where the dimensions are small, and phosphor bronze, copper, stainless steel, etc. are preferable in the case of a larger size. To the base portion 121a of each of the pressing members 121, a plurality of thin and long pressing portions 121b which are in the form of an L-shape and in the form of comb teeth are connected. The roots of them are formed as the spring portion 121c. The pressing portions 121b have generally the same length from the bent portions to the roots, and therefore forces applied from the front ends of the pressing portions to the flexible circuit board 108 via the elastic force of the spring portion 121c become generally equal.

Figure 15:
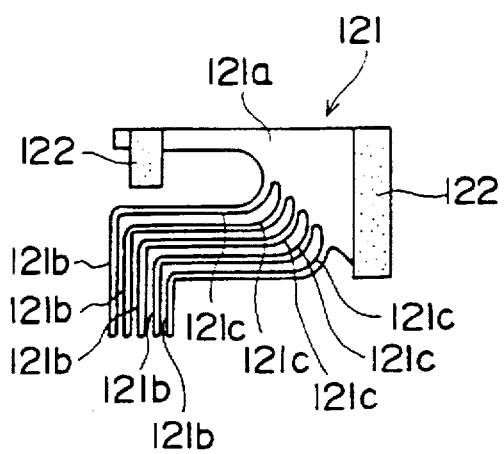
FIG. 15 is a front view of the plate-like pressing member which is accommodated in the case of the pressing unit shown in FIG. 14.

In FIG. 15, tapes 122 (indicated by dots) are respectively adhered to the two end portions of the base portion 121a in the pressing member 121. The pressing portion 121b is deformed by the function of the spring portion 121c when pushing the flexible circuit board 108. The tape 122 is provided as a spacer between the pressing members 121 so that the pressing portions 121b of the adjoining pressing members 121 do not interfere with each other and can smoothly operate at this time. Accordingly, in place of the tape 122, it is also possible to make this part thicker by surface treatment such as plating, or a similar effect can be obtained if a component acting as another spacer is interposed. A plurality of pressing members 121 having such a configuration are restrained at the front and back by the engagement portion 119a and the rear wall 119c, restrained at the left and right by the two side walls 119d, and restrained at the top and bottom by the bottom portion 119b and the lid 118 and are accommodated in the case body 119 as shown in FIG. 13.

In the above-described second embodiment, when the liquid crystal display panel 101 is inspected, the connecting terminals 104 of the flexible circuit board 108 are pressed against the connecting terminals 111 of the liquid crystal display panel 101 by pressing the back surface of the flexible circuit board 108 by the pressing unit 109, so the two are electrically connected. At this time, in the second embodiment, the pressing members 121 are fabricated by a thin metal plate, and therefore the pressing portion 121b thereof can reliably press between a plurality of connecting terminals with a generally equal contact pressure. Also, where the pressing apparatus 106 is pushed by a mechanical apparatus etc., even if there is a slight variation in the pushing force whenever the pressing apparatus is pushed, due to the flexing of the spring portion 121c, there is no damage of the flexible circuit board 108 and no influence exerted upon the contact pressure.

Also, where the pressing unit 109 is inclined to the front or back with respect to the insulating substrate 102 in FIG. 13, the amounts of flexing of the spring portions 121c of the pressing members 121 become different and the pressing force of each pressing portions 121b changes, but there is no difference in the pressing force among the pressing members 121, and therefore no variation is caused in the contact pressure in the contact surfaces among the connecting terminals. Further, in the second embodiment, since each area between connecting terminals is pressed by a plurality of pressing portions 121b, connection with a low resistance value is made possible. Also, since pressing is performed by the pressing portions 121b having the spring portions 121c in this way, even if there is a slight variation in the height of the contact surfaces of the connecting terminals 104 of the substrate 102, it is possible to ensure reliable contact of all of them and in addition to obtain a generally equal contact pressure.

Figure 16:
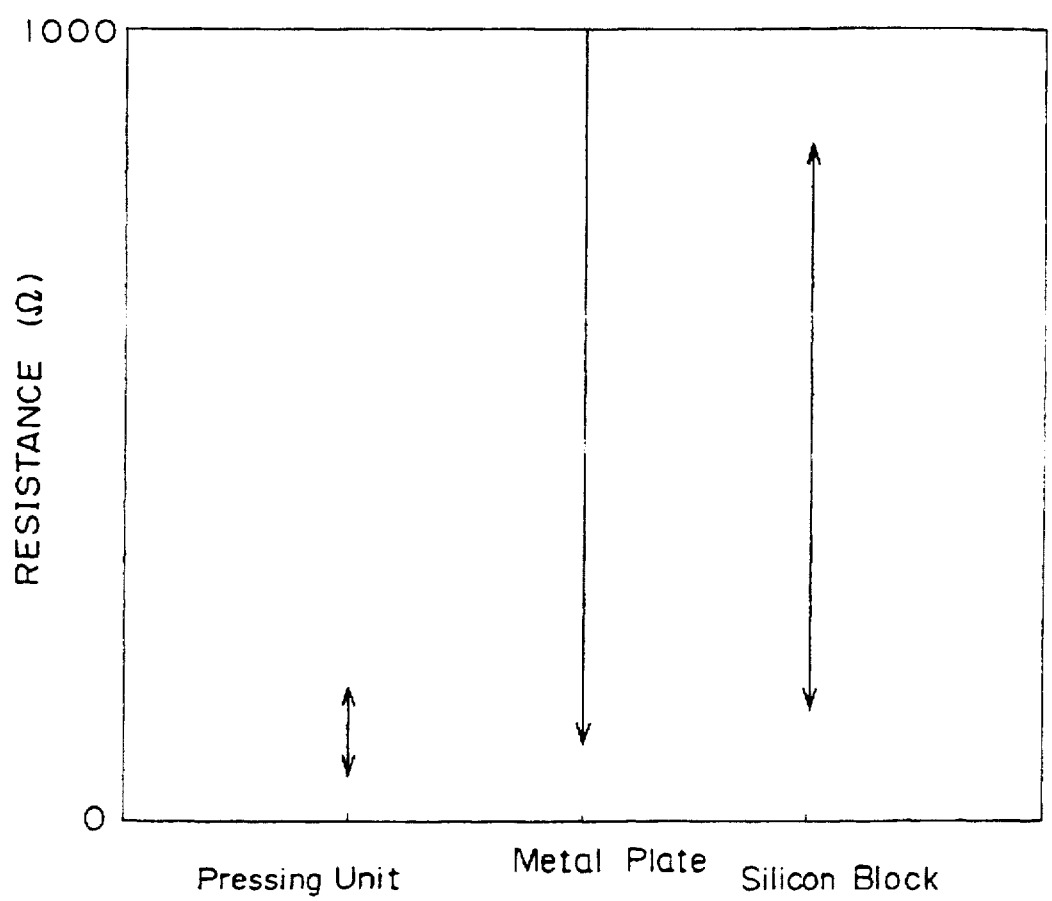
FIG. 16 is a graph showing the experimental comparative data between the first embodiment of the present invention and another example of the configuration.

FIG. 16 shows the results of measurement of the variation of the resistance values in the connecting terminals 104 in a case where a flexible circuit board 108 is pressed by the pressing apparatus 106 of the second embodiment, a case where the same flexible circuit board 108 is pressed by a rigid metal plate which does not resiliently deform much at all, and a case where the same flexible circuit board 108 is pressed by a block made of a silicone rubber which can resiliently deform. Note that the pressing member 121 fabricated based on the second embodiment is made of phosphor bronze and the thickness thereof is 0.15 millimeter. Also, 0.05 millimeter thick tape is used. 180 such pressing members 121 were superposed in the case to constitute the pressing unit 109. The measurement of the resistance value was carried out by connecting one end of the tester to the flexible circuit board 108 and bringing the contactor into contact with individual indium-tin-oxide films (ITO) serving as the connecting terminals 104 of the liquid crystal display panel 101. The total weight was 5008 grams. It will be clearly understood from FIG. 16 that the second embodiment of the present invention exhibits excellent effects.

Figure 17:
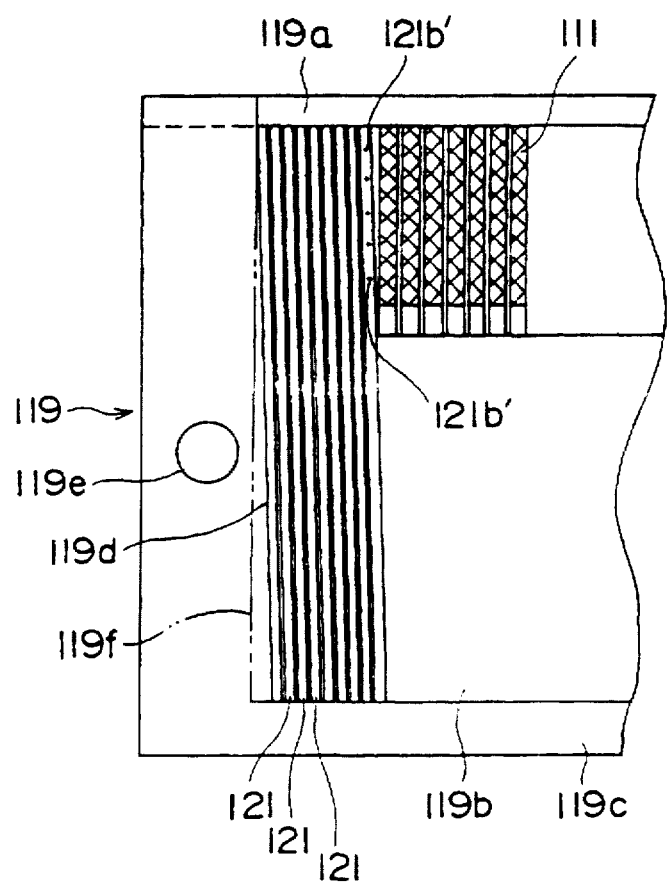
FIG. 17 is an explanatory view of the top surface showing a state where the lid of the other pressing unit which is used in the second embodiment is removed.

FIG. 17 is a top explanatory view showing a modification of the pressing unit 109 to be used in the second embodiment. In this figure, the pressing unit 109 is shown in a state where the lid 118 is removed. The same references are given to the same constituent elements as those of the examples of the configuration shown in FIG. 12 through FIG. 14. The pressing member 121 shown in FIG. 17 is accommodated in the case body 119 at a posture different from those of the examples of the configuration of FIG. 12 through FIG. 15. Note that, 119e is a screw hole and is for attachment the lid 118a by the screw 120. Also, 121b' indicate five pressing points of the pressing portion 121b. The characteristic of this example resides in that the pressing member 121 is disposed while being inclined with respect to the arrangement of the connecting terminals 111 of the flexible circuit board 108. For this reason, the side wall 119d of the case body 119 is formed so that it becomes oblique. However, where such a formation is not appropriate, it is also possible that a plate 119f of the form of a wedge be interposed as indicated by the two-dotted line. Also, needless to say the shape of the side wall 119d on the opposite side is made a shape corresponding to this. By adopting such a configuration, even in a case where the pitch of the connecting terminals 104 and 111 is very fine, the same number of pressing points can be obtained between the connecting terminals without fail.

Figure 18A:
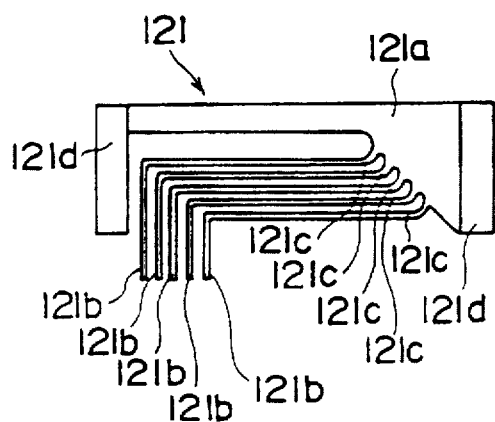
FIG. 18A is a front view showing a first modification of the plate-like pressing member which is used in the second embodiment.
Figure 18B:
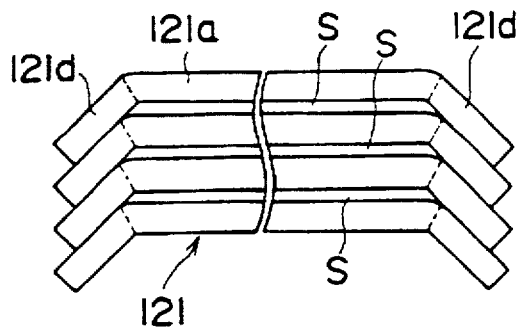
FIG. 18B is an explanatory view of the top surface showing a state where the two ends of the plate-like pressing member shown in FIG. 18A are folded back in the same direction and a plurality of members are superposed on each other.
Figure 18C:
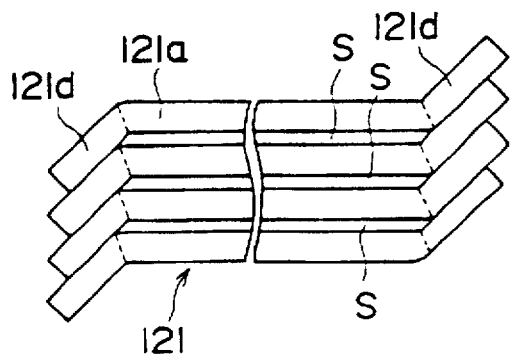
FIG. 18C is an explanatory view of the top surface showing a state where the two ends of the plate-like pressing member shown in FIG. 18A are folded back in opposite directions to each other and a plurality of members are superposed on each other.

Next, four other examples of the shape of the pressing member 121 will be explained by using FIGS. 18A, 18B, 19, 20 and 21. In these figures, the same references are given to elements equivalent to those in the above- described examples of configuration of the second embodiment. First, in FIG. 18A showing a first other example of the shape of the pressing member 121, both of the two ends 121d of the base portion 121a are folded back. A case where these fold-back directions are the same is shown in FIG. 18B, and a case where they are opposite is shown in FIG. 18C. Both of FIG. 18B and FIG. 18C are top views where a plurality of pressing members 121 are superposed on each other. As seen also from these figures, by adopting such a shape, it becomes possible to provide a space S between the base portions 121a of the pressing members 121. Accordingly, it is possible to prevent the pressing portions 121b of the adjoining pressing members 121 from interfering with each other in operation without adhering a tape 122 or applying a surface treatment.

Figure 19:
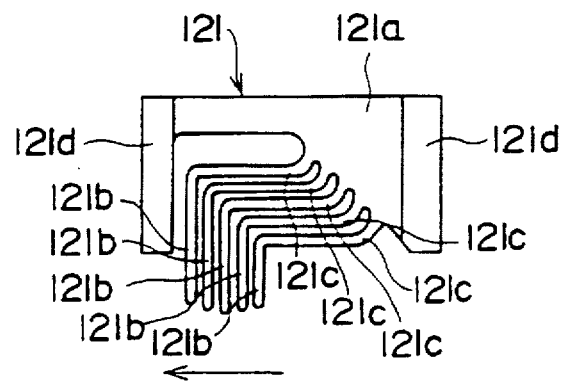
FIG. 19 is a front view showing a second modification of the plate-like pressing member which is used in the second embodiment.

Another example of the shape of the pressing member 121 is shown in FIG. 19. The point of difference of this example from the one shown in FIG. 18 described above is that the lengths of the front ends of the comb tooth pressing portions 121b are different with respect to the pressing surface. Including also this example, the pressing portions 121b indicated heretofore have a configuration whereby the pressing portions per se can easily move the flexible circuit board to be pressed at the time of pressing in the lateral direction thereof (arrow direction in FIG. 19) by a spring function since they are all extended from the roots thereof in the same direction and lateral direction. Such a function enables the surfaces of the connecting terminals to be wiped and the oxidized coating film and stains to be removed, thereby enabling a good electric connection. However, the function can be more reliably obtained by changing the length of the each front end as in this example. Note that, in FIG. 19, a plurality of pressing portions 121b in the pressing members 121 are formed so that the front ends thereof approach the back surface of the flexible circuit board 108 the further from the pressing portions of the two ends toward the central pressing portion. In the figure, a similar effect can be obtained even if they are formed so that the front ends thereof approach the back surface of the flexible circuit board 108 the further from the pressing portion on the right end to the pressing portion on the left end in the figure.

Figure 20:
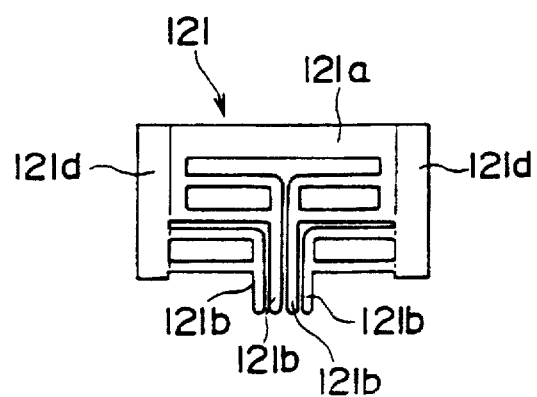
FIG. 20 is a front view showing a third modification of the plate-like pressing member which is used in the second embodiment.

Still another example of the shape of the pressing member 121 is shown in FIG. 20. According to this example, no wiping function as described above can be expected, but two pressing portions 121b each among four pressing portions 121b having the same shape and dimensions are symmetrically provided. In addition, a spring portion 121c as described above is not formed at the roots. Therefore the pressing forces of the pressing portions 121b can be made generally equal.

Figure 21:
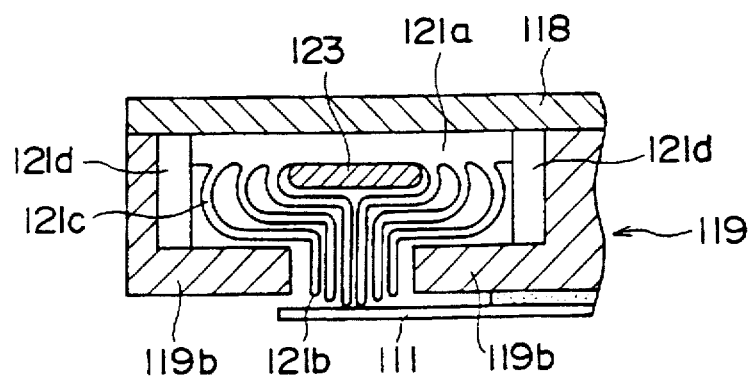
FIG. 21 is an explanatory view of a fourth modification of the plate-like pressing member which is used in the second embodiment.

Still another example of the shape of the pressing member 121 is shown in FIG. 21. In this figure, an example of the case body 119 suitable for accommodating the pressing members 121 shown in FIG. 18 through FIG. 20 is shown. Each three pressing portions 121b shown in this figure are symmetrically provided. These three have different shapes for the spring portion 121c and therefore are inevitably different in the elastic force. Where such a shape is adopted, when an unexpected force is applied to a spring portion 121c of a pressing portion 121b existing inside, there is a danger that the spring portion 121c may permanently deform. For this reason, in the case of this example, a stopper 123 made of a rigid body is attached to the lower portion of the base portion 121a. of course, where there is no such danger, the stopper is not necessary.

In this way, according to the present invention, various pressing units 109 can be obtained in accordance with the required specifications. Further, in the above-described second embodiment, as shown in FIG. 11, the pressing units 109 are disposed in a zigzag manner, but by increasing the size of the pressing unit 109, the number of the pressing unit 109 can be reduced, and in certain cases, it is possible to dispose one pressing unit each at each side of the liquid crystal display panel 101. Moreover, it is also possible for the pressing unit 109 to merely appropriately secure the pressing members 121 relative to each other, and the case body 119 as illustrated is not always necessary. Further, the pressing apparatus 106 can be used for establishing electric connection with various electric components such as an IC socket, connector, etc. and various circuits other than an inspection apparatus of a liquid crystal display panel. Also, in that case, it is sufficient that the pressing apparatus 106 be disposed so as to be able to press the back surface of the flexible circuit boards, and it is also possible to move the hard substrate side and press the same not moving the pressing apparatus 6 as in the second embodiment.

Figure 22:
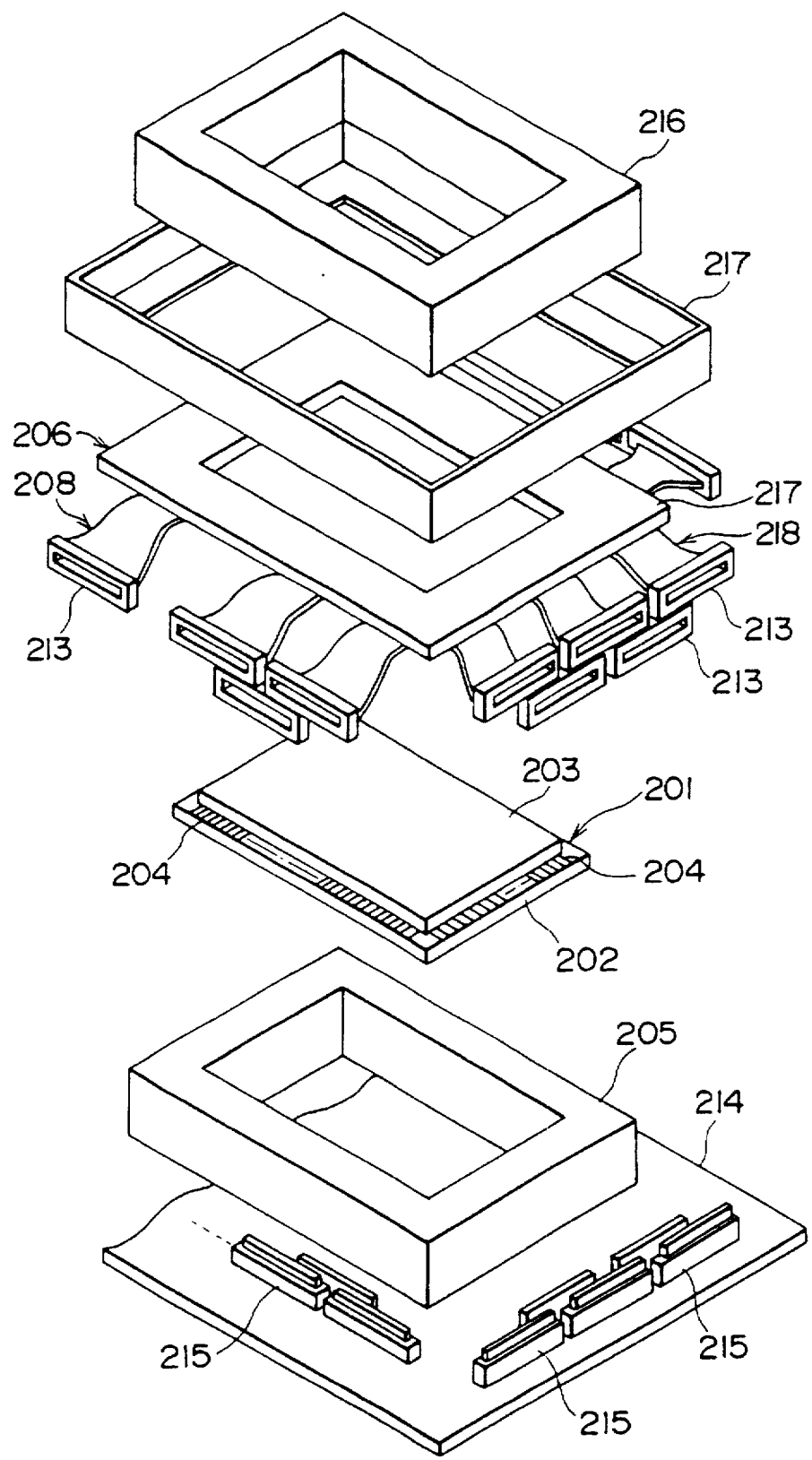
FIG. 22 is an exploded perspective view of the inspection apparatus for a liquid crystal display panel using the pressing apparatus according to a third embodiment of the present invention.
Figure 23:
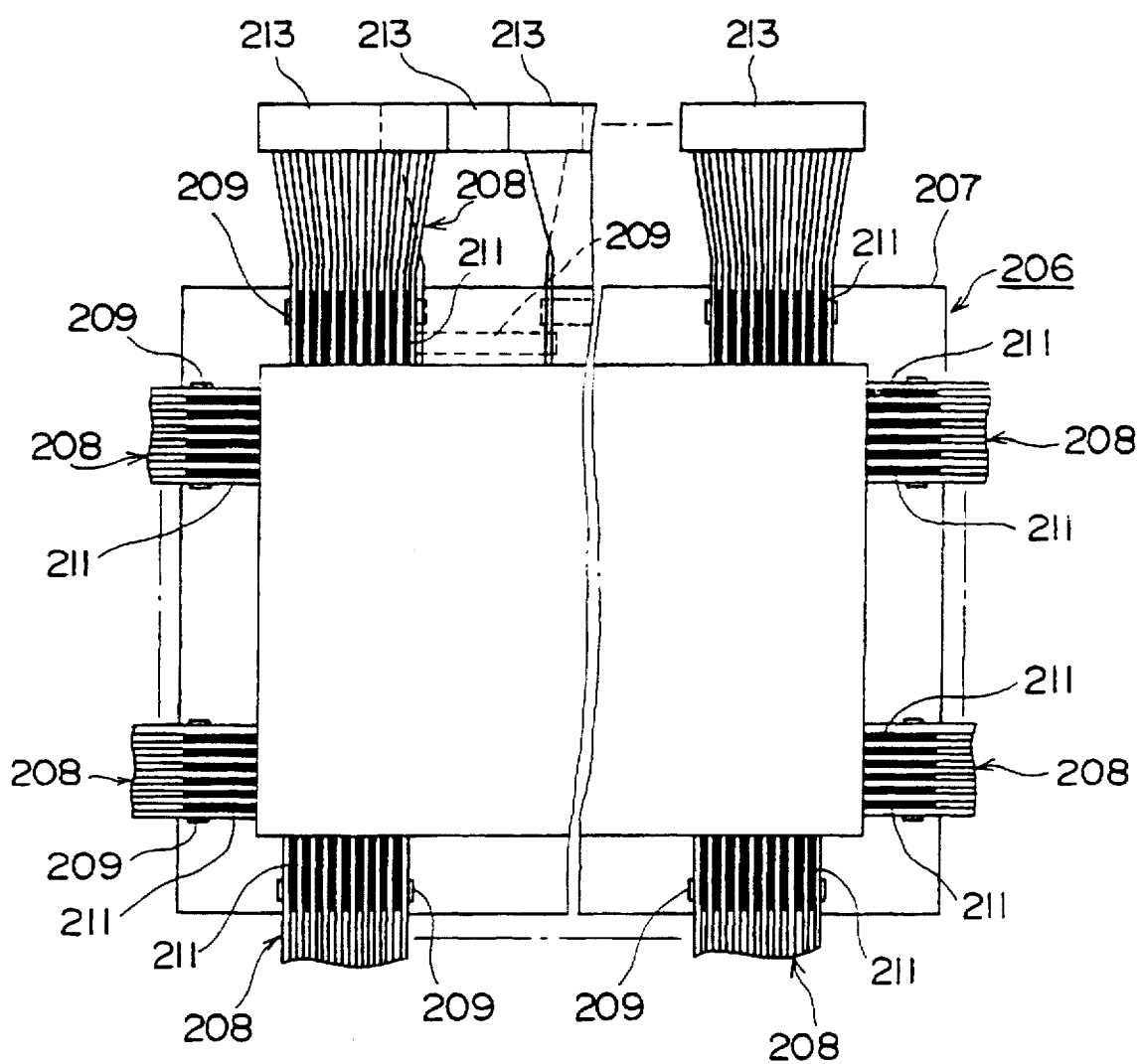
FIG. 23 is a partially cut-away bottom view of the pressing apparatus of the third embodiment.

Next, a third embodiment of the present invention will be explained by referring to FIG. 22 through FIG. 24. Referring to FIG. 22 at first, a liquid crystal display panel 201 has a transparent insulating substrate 202 made of a glass or the like and a liquid crystal display portion 203 formed on this. On the periphery of the surface of the insulating substrate 202, a plurality of connecting terminals 204 connected to the display elements disposed inside the liquid crystal display portion 203 are arranged at extremely fine intervals. The connecting terminals 204 are usually formed by an electrode film of indium-tin-oxide film (ITO). The liquid crystal display panel 201 is placed positioned on the base stand 205. When the liquid crystal display panel 201 is a transparent type, an illumination device is disposed inside the base stand 205.

The pressing apparatus 206 is for pressing the contact terminals 211 of the flexible circuit boards 208 against the connecting terminals 204 arranged on the peripheral portions of the insulating substrate 202 from an upper portion thereof. This pressing apparatus 206 is constituted by a pressing plate 207 and a plurality of pressing members 209. The flexible circuit boards 208 and the pressing members 209 are attached to the pressing plate 207 by an adhesive 212. At one end portion of the flexible circuit boards 208, silver paste is applied onto the insulating film 210 to form connecting terminals 211. The number of the connecting terminals 204 and the number of the connecting terminals 211 are the same, and also the inter-terminal pitches thereof are the same. The pressing members 209 are disposed in a zigzag manner in the pressing plate 207 as shown in FIG. 23.

As shown in FIG. 22, connectors 213 are attached to the other end portions of the flexible circuit boards 208. The connectors 213 can be connected to connectors 215 provided on the substrate 214. The connectors 215 are connected to a liquid crystal driving circuit (not illustrated). The liquid crystal display portion 203 of the liquid crystal display panel 201 is turned on by this driving circuit, and the state of display thereof is inspected by the naked eye etc. The connectors 215 are connected to the drive circuit of the liquid crystal display panel 201, and a state displayed on the liquid crystal display portion 203 is inspected by the naked eye etc. by this drive circuit. Also, in the upper portion of the pressing apparatus 206, a weight 216 for pushing the pressing apparatus 206 and a supporting frame 217 which enables adjustment of positioning are provided.

Figure 25:
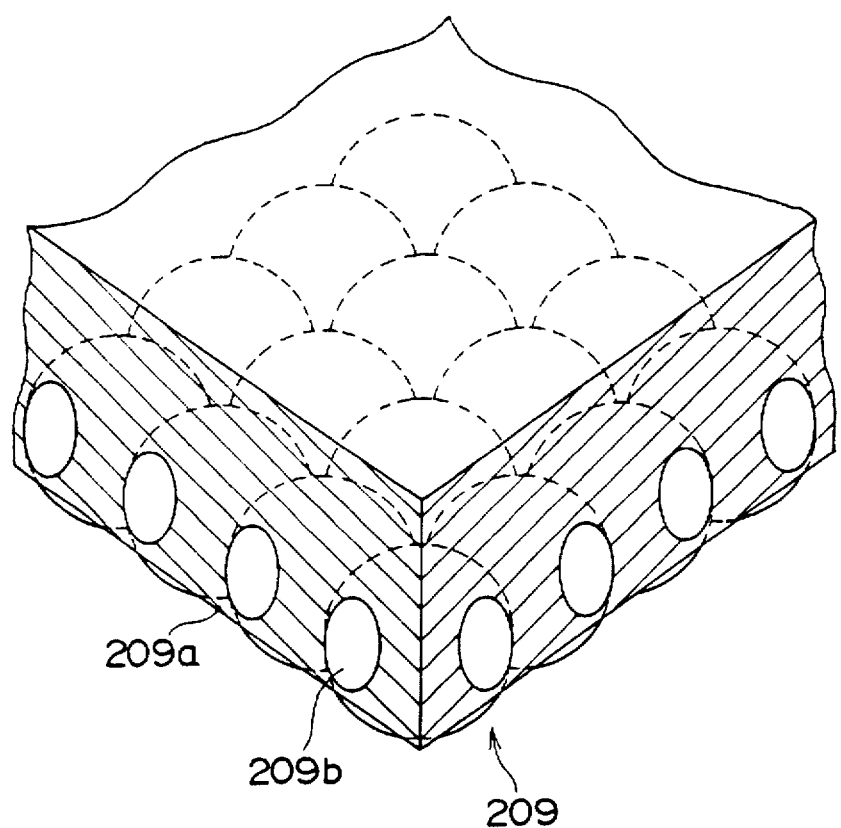
FIG. 25 is a perspective enlarged cross-sectional view of the pressing member which is used in the pressing apparatus of the third embodiment.

In an above-described pressing member 209, as shown in FIG. 25, a plurality of spherical rigid bodies 209b are embedded in a plate-like elastic body 209a with intervals between adjoining rigid bodies and with almost a uniform distribution. The elastic body 209a is preferably made of a silicone rubber, but any material can be used so far as it has weather resistance and elasticity, and of course, also an ordinary rubber can be used. Moreover, the spherical rigid body 209b is made of a steel ball, but it is not restricted to this, and for example, a glass bead, a ceramic ball, etc. can be used.

Figure 26:
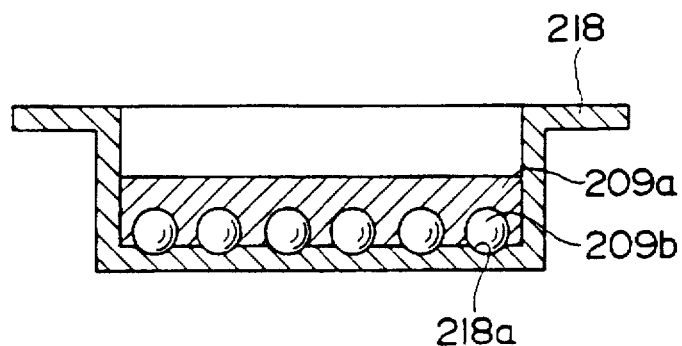
FIG. 26 is an explanatory view showing one example of a fabrication method of the pressing member shown in FIG. 25.

Therefore, one example where such a pressing member 209 is fabricated by a silicone rubber and steel balls will be simply explained by using FIG. 26. A plurality of dimples 218a are formed in the bottom surface of the tray 218 given the predetermined shape. The steel balls 209b are disposed in those dimples 218a. Next, silicone rubber 209a is poured. After complete solidification, the member is taken out of the tray 218. The pressing member 209 fabricated in this way has such a configuration with parts of the rigid bodies 209b projecting from only one surface of the plate-like elastic body 209a as shown in FIG. 25. Of course, if the amount of the silicone rubber poured is reduced, it is also possible to change the configuration so that the rigid bodies 209b projects from both surfaces of the plate-like elastic body 209a. Note that, if the elastic body 209a is not present in all of the areas between the rigid bodies 209b of the pressing member 209, the rigid bodies 209b cannot smoothly move in some cases, and therefore desirably the dimples 218a are formed while being spaced from each other to a certain extent. Also, it is not necessary to provide the dimples 218a in a completely uniform distribution when the size of the rigid bodies 209b is much smaller than the length of the connecting terminals 204 and 211 mentioned previously. It is sufficient so far as the dimples 218a are formed so that the rigid bodies 209b are substantially uniformly embedded in the overall pressing member 209.

Figure 24:
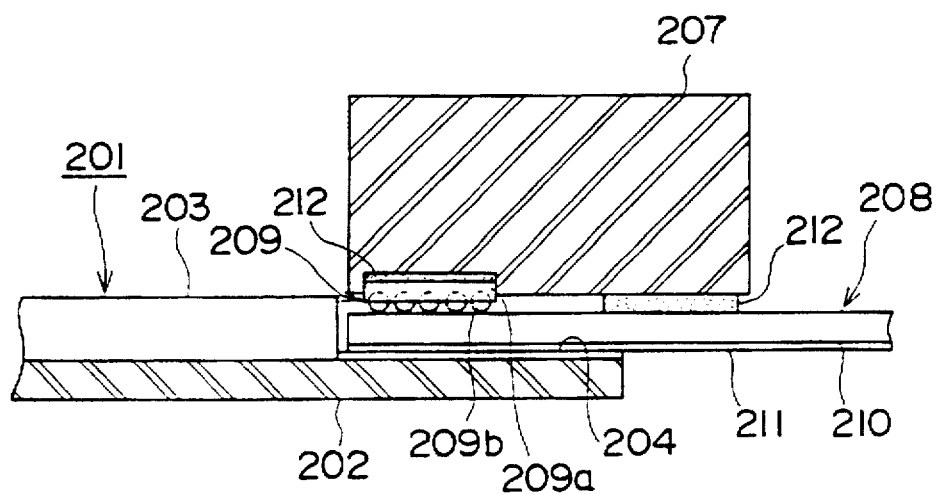
FIG. 24 is a longitudinal cross-sectional view of principal parts showing a pressing state of the pressing apparatus of the third embodiment.
Figure 27:
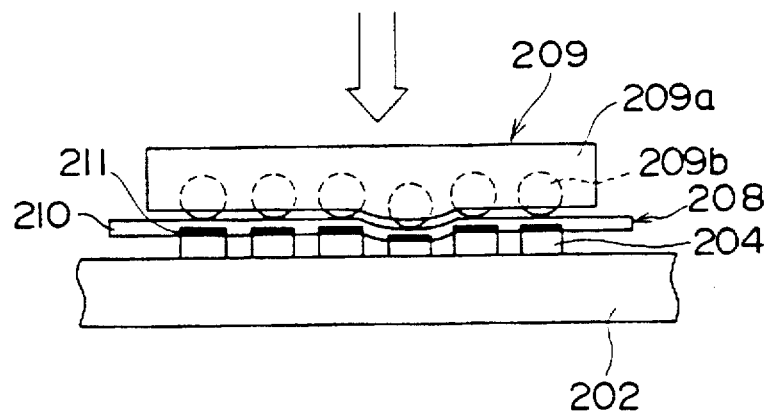
FIG. 27 is an explanatory view showing the state where the pressing member shown in FIG. 25 presses the flexible circuit board.

When the liquid crystal display panel 201 is inspected, as shown in FIG. 24, the connecting terminals 211 of the flexible circuit board 208 are pressed against the connecting terminals 204 of the liquid crystal display panel 201 by pressing the pressing members 209 against the back surface of the flexible circuit board 208, whereby the connecting terminals 204 and 211 are electrically connected. At this time, as shown in for example FIG. 27, even if all of the heights of the connecting terminals 204 formed on the substrate 202 are not uniform, the pressing force applied by the downward movement of the pressing plate 207 can cause contact at all the connecting terminals by utilizing the elasticity of the elastic body 209a. In addition, the pressing with respect to the flexible circuit board 208 is directly carried out by the rigid bodies 209b, and therefore the efficiency of transmission of force to the downward direction is good. Even if there is a slight difference in the heights of the connecting terminals 204 as described above, the rigid bodies 209b can independently vertically move by the function of the elastic body 209a present between the rigid bodies 209b, and therefore it is possible to obtain a generally equal contact pressure in the contact surface between all connecting terminals 204 of the liquid crystal display panel 201 and the connecting terminals 211 of the flexible circuit board 208.

Figure 28:
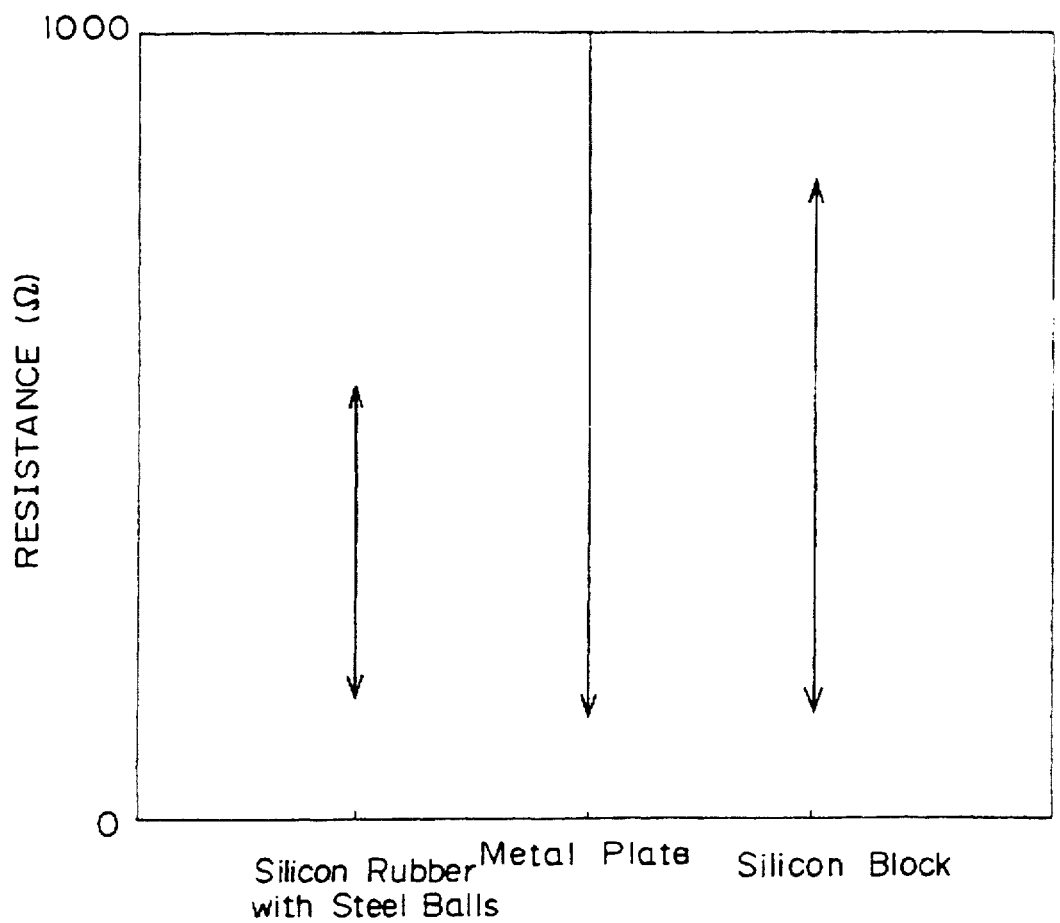
FIG. 28 is a graph showing experimental comparative data between the third embodiment of the present invention and another example of the configuration.

FIG. 28 shows the results of measurement of the variation of the resistance values in the connecting terminals 204 in a case where a flexible circuit board 208 is pressed by a pressing member 209 made of a silicone rubber containing steel balls according to the above-described third embodiment, a case where the same flexible circuit board 208 is pressed by a rigid metal plate which does not resiliently deform much at all, and a case where the same flexible circuit board 208 is pressed by a block made of a silicone rubber which can resiliently deform. Note that the diameter of the steel ball used in the pressing member 209 in this case is 0.5 millimeter. The measurement of the resistance value was carried out by connecting one end of the tester to the flexible circuit board 208 and bringing the contactor into contact with individual indium-tin-oxide films (ITO) forming the connecting terminals 204 of the liquid crystal display panel 201. The effect of the present invention will be clearly understood from this FIG. 28. Namely, the conditions of a good pressing member are that all connecting terminals be reliably brought into contact, connection be made so that a low resistance value is obtained, and the variation be small in the resistance values among terminals. Silicone rubber containing steel balls clearly exhibits an excellent effect.

Figure 29:
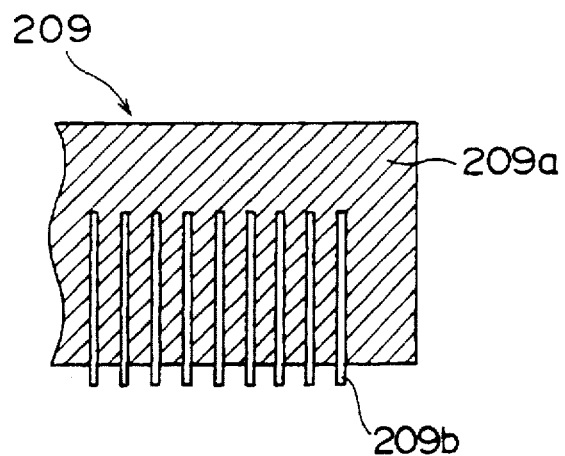
FIG. 29 is a partial longitudinal cross-sectional view showing a first modification of the pressing member which is provided with rod-like rigid members and is used in the third embodiment.

FIG. 29 through FIG. 35 show other examples of the configuration of the pressing member 209 used in the third embodiment of the present invention. The pressing member 209 shown by the cross-sectional view in FIG. 29 is one in which the rigid bodies 209b are formed in the shapes of rods. Similar to the above described spherical rigid bodies, various materials can be applied to this rod-like rigid body 209b, but when considering the strength etc. on machining and costs, iron, phosphor bronze, etc. are preferred. Also, there arises no problem whether the shape of the rigid bodies 209b is a round rod or square rod. Further, as for the disposition of the rod-like rigid bodies 209a, it is also possible to exactly align the same in a vertical direction and lateral direction as shown by the case of the spherical rigid bodies 209b in FIG. 25, or adopt various types of configurations and various types of arrangement methods instead of with the spherical rigid bodies 209b explained below. When the shape of the rigid bodies 209b in the present invention is made a rod in this way, there is an advantage in coping with configurations wherein the pitch among the connecting terminals is finer in comparison with the spherical rigid bodies.

Figure 30:
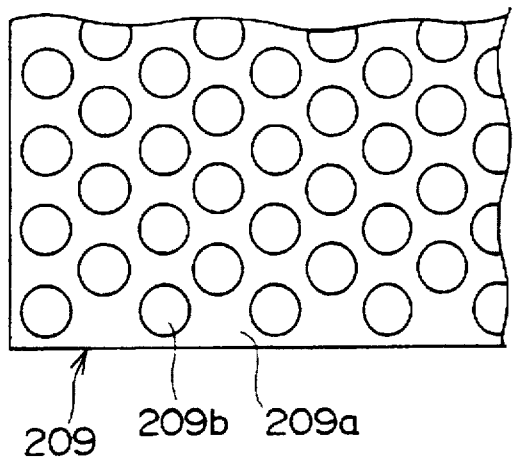
FIG. 30 is a partial plan view of a second modification of the pressing member which is used in the third embodiment and perspectively shows a different state of arrangement of the spherical rigid members.

FIG. 30 is a partial plan view showing still another example of the configuration of the pressing member 209 which is used in the third embodiment of the present invention. In the same figure, spherical rigid bodies 209b are shown in a look-through manner. As described before, where the rigid bodies are arranged as shown in FIG. 25, for dealing with a configuration wherein the pitch among the connecting terminals is fine, spherical rigid bodies clearly become disadvantageous in comparison with rod-like ones. Therefore, that point has been improved on in the pressing member 209 shown in FIG. 30. According to this example, the distance between the spherical centers of the arranged rigid bodies 209b can be made smaller. Accordingly, in this case, rather than arrangement in the vertical direction of arrangement of the rigid bodies 209b along the longitudinal direction of the contact terminal, arrangement in the lateral direction enables a finer pitch to be dealt with.

Figure 31:
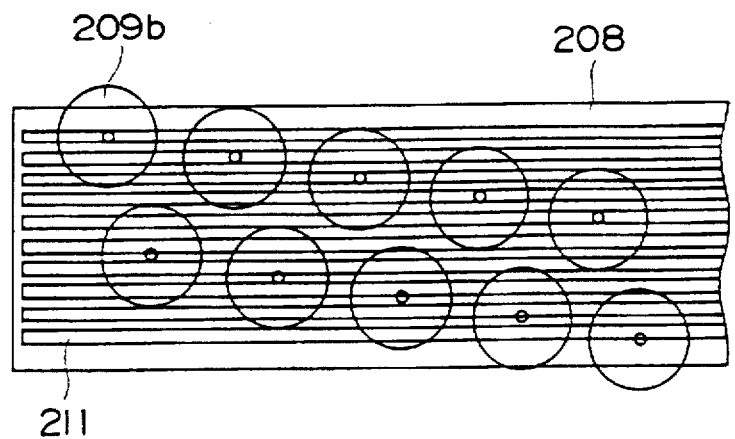
FIG. 31 is an explanatory view showing another arrangement example of the spherical rigid bodies of the flexible circuit board of the pressing member which is used in the third embodiment.

FIG. 31 is an explanatory view showing another modification of the arrangement of the rigid bodies 209b in the pressing member 209. In this figure, the straight lines connecting the spherical centers of two columns of rigid bodies 209b are made oblique with respect to the longitudinal direction of the connecting terminals 211 of the flexible circuit board 208. Note that, in the figure, the small circles drawn at the center portions of the rigid bodies 209b show the effective surface areas for pressing the flexible circuit board 208 by the rigid bodies 209b. As seen from the figure, all of the connecting terminals 211 are pressed by the rigid bodies 209b. By this, it becomes possible to deal with even with a configuration of connecting terminals having a considerably fine pitch.

Figure 32A:
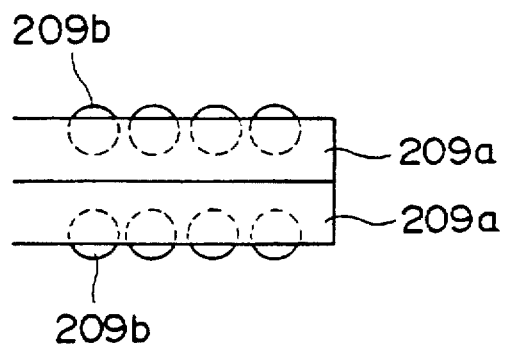
FIG. 32A shows a third modification of the pressing member which is used in the third embodiment and is an explanatory view.
Figure 32B:
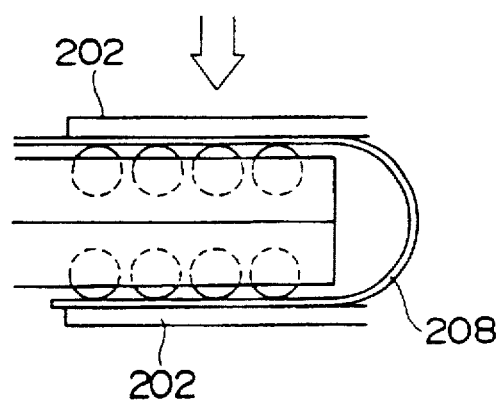
FIG. 32B shows the pressing state of the pressing member of FIG. 32A.

FIG. 32A shows another example of the configuration of the pressing member 209 which is used in the third embodiment of the present invention. This pressing member 209 is provided with two plate-like elastic bodies 209a. In the same way as the pressing member 209 shown in FIG. 25, a plurality of spherical rigid bodies 209b are provided in each elastic body 209a of the pressing member 209 shown in FIG. 32A, and a part of each rigid body 209a is exposed from one surface, that is, the front surface of the elastic body 209a. The two elastic bodies 209a are secured to each other at their back surfaces by an adhesive. Accordingly, in the pressing member 209 shown in FIG. 32A, part of the spherical rigid bodies 209b are exposed at both surfaces thereof. If a pressing member 209 shown in FIG. 32A is used, as shown in FIG. 32B, by bending one flexible circuit board 208 and bringing the same into contact with the two surfaces of the pressing member 209, and further pressing two substrates 202 from both sides of them, the connecting terminals of the respective substrates 202 and the connecting terminals of the flexible circuit board 208 can be electrically connected.

Figure 33A:
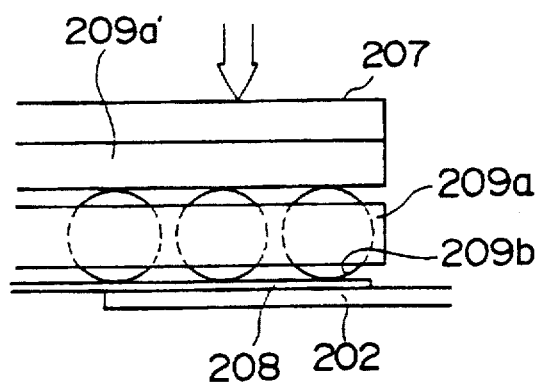
FIG. 33A is an explanatory view showing a fourth modification of the pressing member which is used in the third embodiment where the pressing member is pressed at one surface.
Figure 33B:
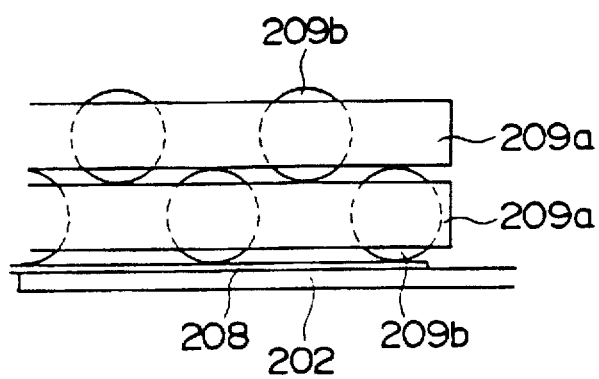
FIG. 33B is an explanatory view showing a fifth modification of the pressing member which is used in the third embodiment where the pressing member is pressed at its one surface.
Figure 33C:
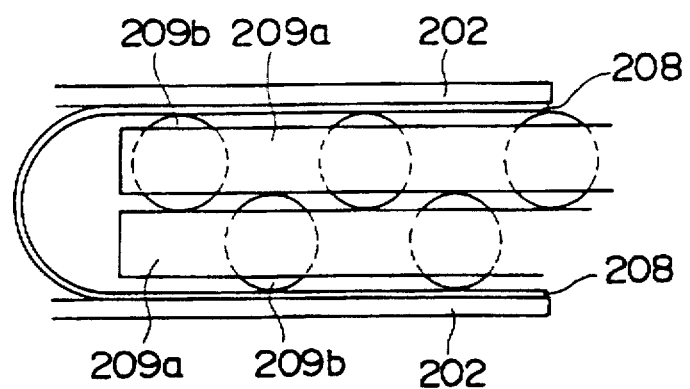
FIG. 33C is an explanatory view showing a sixth modification of the pressing member which is used in the third embodiment where the pressing member is pressed at its two surfaces.

FIG. 33A and FIG. 33B show further examples of the configuration of the pressing member 209 which is used in the third embodiment of the present invention. The pressing members 209 shown in these figures have the plate-like elastic body 209a and a plurality of spherical rigid bodies 209b embedded in the elastic body 209a. Parts of the rigid bodies 209b are exposed at the two surfaces of the elastic body 209a. Accordingly, when directly pressing this by the pressing plate 207, the rigid bodies 209b cannot be resiliently brought into contact with the flexible circuit board 208. Therefore, the pressing member 209 shown in FIG. 33A has the elastic body 209a and another plate-like elastic body 209a' interposed between the elastic body 209a and the pressing plate 207. The pressing member 209 shown in FIG. 33B is constituted by superposing two elastic bodies 209 on each other so that the rigid bodies 209b will not interfere with each other. Further, FIG. 33C shows another method of usage of the pressing member 209 shown in FIG. 33B. Namely, if the pressing member 209 shown in FIG. 33B is used, as shown in FIG. 33C, by bending one flexible circuit board 208 and bringing the same into contact with the two surfaces of the pressing member 209, and further pressing two substrates 202 from both sides of them, the connecting terminals of the substrates 202 and the connecting terminals of the flexible circuit board 208 can be electrically connected.

Figure 34A:
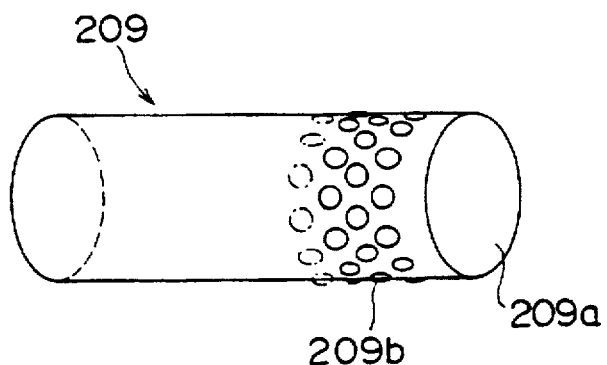
FIG. 34A is an explanatory view showing a seventh modification of the pressing member which is used in the third embodiment, constituted in the form of a column.
Figure 34B:
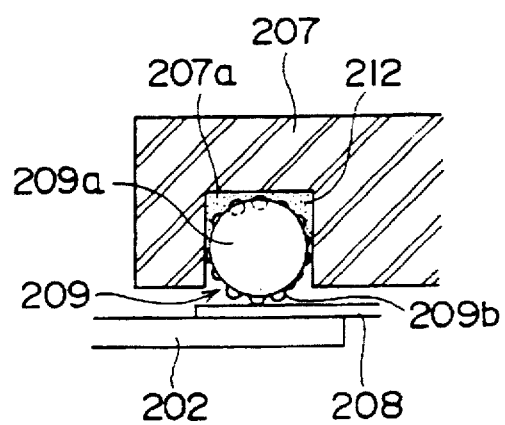
FIG. 34B is an explanatory view showing a form of usage of the pressing member of FIG. 34A.

FIG. 34A and FIG. 34B show still another example of the configuration of the pressing member 209 which is used in the third embodiment of the present invention. As shown in FIG. 34A, the pressing member 209 has an elastic body 209a formed as a column and spherical rigid bodies 209b embedded in the elastic body 209a. Parts of the rigid bodies 209b are exposed from the circumferential surface of the elastic body 209a. The pressing member 209 having such a configuration is secured by for example an adhesive 212 etc. to a concave portion 207a formed in the pressing plate 207 as shown in FIG. 34B so that a part of the pressing member 2 is projected from the concave portion 207.

Figure 35:
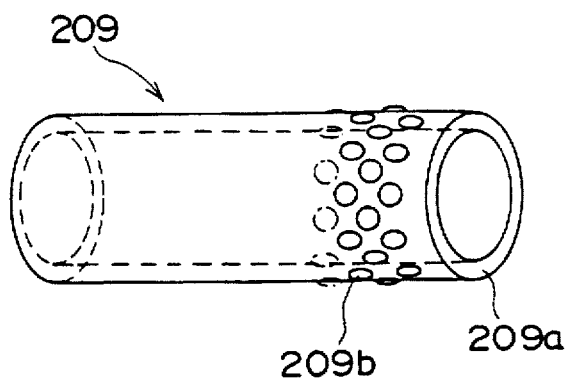
FIG. 35 is an explanatory view showing an eighth modification of the pressing member which is used in the third embodiment which is constituted in the form of the column.

Further, FIG. 35 shows an example wherein the elastic body 209a of the pressing member 209 is formed in a cylindrical state. The pressing member 209 shown in the figure can be used by a similar method to the method shown in FIG. 34B. Note, in the case of the pressing member 209 having a cylindrical elastic body 209a, parts of the rigid bodies 209b can be exposed not only in the outer circumferential surface of the elastic body 209a, but also in the inner circumferential surface thereof. Further, it is also possible if a pressing member 209 having this columnar or cylindrical elastic body 209a be detachably fitted in the concave portion 207a of the pressing plate 207 by utilizing the elastic force of the elastic body 209a without the use of the adhesive 212. In this case, the pressing member 209 can select the frontmost position to be brought into contact with the flexible circuit board 208 whenever this is used.

Note that, also in the pressing member 209 shown in FIG. 32 through FIG. 35, as mentioned in relation to FIG. 30 and FIG. 31, it is possible to select various arrangements of the rigid bodies 209b. Also, the shape of the rigid body 209b is not restricted to a sphere, and there is no problem even if it is a rod like shape or other shapes. Also, in the third embodiment shown in FIG. 23, the pressing members 209 are disposed in a zigzag manner, but it is possible to reduce the number of the pressing member 209 by increasing the size of the pressing member 209. In some cases, also an arrangement of only one pressing member each at each side of the liquid crystal display panel 201 is possible. Further, the pressing apparatus 6 can be used also for establishing electric connection with various electric components such as an IC socket, connector, etc. and various circuits other than the inspection apparatus of a liquid crystal display panel. Moreover, it is also possible to use the same as a pressing apparatus for mutually connecting flexible circuit boards of a type as disclosed in Japanese Unexamined Patent Publication No. 6-21160. In the end, it is sufficient so far as the pressing apparatus 206 is arranged so as to be able to directly press the flexible circuit boards and, as described above, does not prevent pressing by moving the hard substrate without the movement of the pressing apparatus 206.

What is claimed is:

1. A pressing apparatus for electrically connecting a plurality of connecting terminals formed at a front surface of a flexible circuit board and a plurality of connecting terminals arranged in parallel to each other on electric components by pressing the back surface of said flexible circuit board, comprising:

a supporting member; and a plurality of pressing members which are arranged in parallel to each other in a direction which is substantially perpendicular to a direction of arrangement of said connecting terminals of said electric components, wherein each of said pressing members has a base portion which is attached to said supporting member, a pressing portion which is spaced from said base portion and extends along said direction of arrangement of said connecting terminals of said electric components and a spring portion which is connected to said base portion and said pressing portion, said spring portion providing an urging force against said pressing portion and against the back surface of said flexible circuit board.

2. A pressing apparatus as set forth in claim 1, wherein said supporting member has a case having an opening facing the back surface of said flexible circuit board, and said base portion of said each pressing member is attached inside said case so that the front end of said pressing portion is projected from said case.

3. A pressing apparatus as set forth in claim 2, wherein an engagement portion is formed in said pressing portion of said each pressing member, and said engagement portion is formed so as to be engaged with an engagement portion provided in said case by an urging force of said spring portion.

4. A pressing apparatus as set forth in claim 1, wherein said spring portion of each said pressing member is connected with said base portion at one position and with said pressing portion at two positions.

5. A pressing apparatus as set forth in claim 1, wherein said spring portion of each said pressing member is formed by a first spring portion for urging said pressing portion in a lateral direction which is parallel to said direction of arrangement of said connecting terminals of said electric components, and a second spring portion for urging said pressing portion in a vertical direction which is perpendicular to said lateral direction.

6. A pressing apparatus as set forth in claim 1, wherein said base portion of each said pressing member is formed with a surface treatment layer so as to have a thickness which is larger than that of said spring portion and said pressing portion.

7. A pressing apparatus as set forth in claim 1, wherein a spacer made to abut against the base portion of the adjoining pressing member is provided in said base portion of each said pressing member.

8. A pressing apparatus as set forth in claim 1, wherein said base portion of each of said pressing members has two ends folded back at a predetermined angle with respect to the longitudinal direction of said pressing portion.

9. A pressing apparatus for electrically connecting a plurality of connecting terminals arranged in parallel to each other on electric components with the connecting terminals formed in the front surface of said flexible circuit board at the same pitch as that for the connecting terminals of said electric components by pressing the back surface of the flexible circuit board, comprising:

a supporting member; and a plurality of pressing members which are arranged in parallel to each other in a direction which is parallel to a direction of arrangement of said connecting terminals of said electric components, wherein each of said pressing members has a base portion which is attached to said supporting member and a plurality of pressing portions which are connected to said base portion and have front ends which are arranged in a direction generally orthogonal to the direction of arrangement of said connecting terminals of said electric components, each of said pressing portions being pressed against the back surface of said flexible circuit board by an urging force generated therein.

10. A pressing apparatus as set forth in claim 9, wherein said respective pressing portions are formed in the form of a generally L-shape so that the front ends thereof extend in a direction perpendicular to the back surface of said flexible circuit board and said respective pressing portions are connected to said base portion via the spring portion.

11. A pressing apparatus as set forth in claim 9, wherein said respective pressing members are disposed so that the direction of arrangement of front ends of said pressing portions is inclined at a predetermined angle with respect to a direction orthogonal to the direction of arrangement of said contact terminals of said electric components.

12. A pressing apparatus as set forth in claim 9, wherein said supporting member has a case having an opening facing the back surface of said flexible circuit board; and the base portion of each said pressing member is attached in said case so that the front end of said pressing portion is projected from said case.

13. A pressing apparatus as set forth in claim 9, wherein said plurality of pressing portions in said respective pressing members are formed so that the front ends of them exist on the same flat plane.

14. A pressing apparatus as set forth in claim 9, wherein said plurality of pressing portions in said respective pressing members are formed so that the front ends of them approach the back surface of said flexible circuit board the further from the pressing portions of the two ends toward the pressing portion at the center.

15. A pressing apparatus as set forth in claim 9, wherein said plurality of pressing portions in said respective pressing members are formed so that the lengths from said base portion to the front ends of said pressing portions are sequentially different.

16. A pressing apparatus as set forth in claim 9, wherein said plurality of pressing portions in said respective pressing members are formed so that elastic forces given to them are different.

17. A pressing apparatus as set forth in claim 9, wherein a spacer made to abut against the base portions of the adjoining pressing members is provided in said base portion of said respective pressing members.

18. A pressing apparatus as set forth in claim 9, wherein the base portion of said each pressing member has two ends respectively folded back at a predetermined angle on the vertical line with respect to the back surface of said flexible circuit board.

19. A pressing apparatus for electrically connecting a plurality of connecting terminals arranged in parallel to each other on electric components with connecting terminals formed in the front surface of said flexible circuit board at the same pitch as that for the connecting terminals of said electric components by pressing the back surface of the flexible circuit board, comprising a pressing member having an elastic body and a plurality of rigid bodies which are embedded in said elastic body so as to be spaced from each other so that the respective rigid bodies are partially exposed from said elastic body in generally the same amount, said pressing member being pressed against the back surface of said flexible circuit board by an exposed portion of said rigid bodies.

20. A pressing apparatus as set forth in claim 19, wherein said respective connecting terminals of said flexible circuit board are extended thin and long; said rigid bodies of said pressing members are arranged so as to exhibit a plurality of columns; and the column of said rigid bodies is extended inclined at a predetermined angle with respect to a longitudinal direction of said connecting terminals of said flexible circuit board.

21. A pressing apparatus as set forth in claim 19, wherein said elastic body has opposite surfaces, and a part of each said rigid body is exposed from one surface of said elastic body.

22. A pressing apparatus as set forth in claim 19, wherein said elastic body has opposite surfaces, a part of each said rigid body is exposed fro both surfaces of said elastic body, and a further elastic body is superposed on one surface of said elastic body.

23. A pressing apparatus as set forth in claim 19, wherein said pressing member has two elastic bodies having opposite surfaces, respectively, said rigid bodies being embedded in of said pressing members so that said rigid bodies are partially exposed from one surface of said elastic bodies, said two pressing members being superposed on each other on the respective other surfaces.

24. A pressing apparatus as set forth in claim 19, wherein said pressing member has two elastic bodies having opposite surfaces, respectively, said rigid bodies being embedded in each of said elastic bodies so that each of said rigid bodies is partially exposed from the opposite surfaces of the corresponding elastic body, said two pressing members being superposed on each other so that the exposed portions of said rigid bodies are spaced apart from each other.

25. A pressing apparatus as set forth in claim 19, wherein said elastic body has a columnar shape; and a part of each said rigid body is exposed from the outer circumferential surface of said elastic body.

26. A pressing apparatus as set forth in claim 19, wherein said elastic body has a cylindrical shape; and a part of each said rigid body is exposed from the outer circumferential surface of said elastic body.

27. A pressing apparatus as set forth in claim 19, wherein each said rigid body has a generally spherical shape.

28. A pressing apparatus as set forth in claim 19, wherein each said rigid body has a cylindrical shape.

29. A pressing apparatus as set forth in claim 19, wherein said elastic body is made of a silicone rubber.

* * * * *